US009113581B2

United States Patent
Campbell et al.

(10) Patent No.: US 9,113,581 B2
(45) Date of Patent: Aug. 18, 2015

(54) VALVE CONTROLLED, NODE-LEVEL VAPOR CONDENSATION FOR TWO-PHASE HEAT SINK(S)

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/519,401

(22) Filed: Oct. 21, 2014

(65) Prior Publication Data
US 2015/0062804 A1    Mar. 5, 2015

Related U.S. Application Data

(63) Continuation of application No. 13/189,598, filed on Jul. 25, 2011.

(51) Int. Cl.
*H05K 7/20*    (2006.01)
*G06F 1/20*    (2006.01)

(52) U.S. Cl.
CPC .............. *H05K 7/20818* (2013.01); *G06F 1/20* (2013.01); *H05K 7/2029* (2013.01); *H05K 7/20309* (2013.01); *H05K 7/20318* (2013.01); *H05K 7/20809* (2013.01); *G06F 2200/201* (2013.01)

(58) Field of Classification Search
USPC .......................... 361/679.46–679.54, 688–722
See application file for complete search history.

(56) References Cited

U.S. PATENT DOCUMENTS

| 4,635,709 A | 1/1987 | Altoz |
|---|---|---|
| 5,604,665 A | 2/1997 | Chrysler et al. |

(Continued)

FOREIGN PATENT DOCUMENTS

CN    101307996 A    11/2008

OTHER PUBLICATIONS

Campbell et al., Office Action for U.S. Appl. No. 14/064,322, filed Oct. 28, 2013 (US. Patent Publication No. 2014/0048242 A1), dated Jan. 14, 2015 (19 pages).

(Continued)

*Primary Examiner* — Courtney Smith
(74) *Attorney, Agent, or Firm* — Steven Chiu, Esq.; Kevin P. Radigan, Esq.; Heslin Rothenberg Farley & Mesiti P.C.

(57) ABSTRACT

Apparatuses are provided for cooling an electronic component(s), which include a heat sink coupled to the electronic component(s), and having a coolant-carrying channel for a first coolant. The first coolant provides two-phase cooling to the electronic component(s), and is discharged from the heat sink as coolant exhaust, which includes coolant vapor. The apparatus further includes a node-level condensation module coupled to the heat sink to receive the coolant exhaust. The condensation module is cooled via a second coolant, and facilitates condensing the coolant vapor in the coolant exhaust. A controller automatically controls the liquid-cooling of the heat sink and/or the liquid-cooling of the node-level condensation module. A control valve adjusts a flow rate of the second coolant of the node-level condensation module, with the valve being automatically controlled by the controller based on a characterization of the coolant vapor in the coolant exhaust.

7 Claims, 17 Drawing Sheets

(56) References Cited

U.S. PATENT DOCUMENTS

| | | | |
|---|---|---|---|
| 6,282,095 | B1 | 8/2001 | Houghton et al. |
| 6,397,936 | B1 | 6/2002 | Crowley et al. |
| 6,498,725 | B2 | 12/2002 | Cole et al. |
| 6,512,834 | B1 | 1/2003 | Banter et al. |
| 6,533,029 | B1 | 3/2003 | Phillips |
| 6,550,530 | B1 | 4/2003 | Bilski |
| 6,591,902 | B1 | 7/2003 | Trent |
| 6,940,712 | B2 | 9/2005 | Chu et al. |
| 6,942,018 | B2 | 9/2005 | Goodson et al. |
| 6,988,534 | B2 | 1/2006 | Kenny et al. |
| 6,994,151 | B2 | 2/2006 | Zhou et al. |
| 7,019,971 | B2 | 3/2006 | Houle et al. |
| 7,104,312 | B2 | 9/2006 | Goodson et al. |
| 7,188,662 | B2 | 3/2007 | Brewer et al. |
| 7,265,979 | B2 | 9/2007 | Erturk et al. |
| 7,274,566 | B2 | 9/2007 | Campbell et al. |
| 7,299,647 | B2 | 11/2007 | Tilton et al. |
| 7,450,386 | B2 | 11/2008 | Silverstein et al. |
| 7,470,403 | B2 | 12/2008 | Beebe et al. |
| 7,477,513 | B1 | 1/2009 | Cader et al. |
| 7,477,517 | B2 | 1/2009 | Khanna et al. |
| 7,511,957 | B2 | 3/2009 | Campbell et al. |
| 7,602,608 | B2 | 10/2009 | Tilton et al. |
| 7,686,071 | B2 | 3/2010 | Silverstein |
| 7,796,389 | B2 | 9/2010 | Edmunds et al. |
| 7,836,597 | B2 | 11/2010 | Datta et al. |
| 7,888,603 | B2 | 2/2011 | Lu et al. |
| 7,907,406 | B1 | 3/2011 | Campbell et al. |
| 8,027,162 | B2 | 9/2011 | Campbell et al. |
| 2,179,677 | A1 | 5/2012 | Campbell et al. |
| 8,179,677 | B2 | 5/2012 | Campbell et al. |
| 8,188,595 | B2 | 5/2012 | Shuja |
| 8,194,406 | B2 | 6/2012 | Campbell et al. |
| 8,208,258 | B2 * | 6/2012 | Campbell et al. ............. 361/699 |
| 8,305,760 | B2 * | 11/2012 | Howes et al. ................. 361/717 |
| 8,351,206 | B2 | 1/2013 | Campbell et al. |
| 8,413,712 | B2 | 4/2013 | Brunchwiler et al. |
| 8,564,952 | B2 | 10/2013 | Campbell et al. |
| 8,711,563 | B2 | 4/2014 | Campbell et al. |
| 8,867,209 | B2 | 10/2014 | Campbell et al. |
| 2003/0057546 | A1 * | 3/2003 | Memory et al. ............. 257/706 |
| 2004/0012914 | A1 | 1/2004 | Chu et al. |
| 2004/0191136 | A1 | 9/2004 | Early |
| 2005/0205241 | A1 | 9/2005 | Goodson et al. |
| 2005/0286227 | A1 | 12/2005 | Erturk et al. |
| 2006/0027356 | A1 | 2/2006 | Sulzer |
| 2006/0032622 | A1 | 2/2006 | Yen et al. |
| 2006/0180300 | A1 | 8/2006 | Lenehan et al. |
| 2007/0034356 | A1 | 2/2007 | Kenny et al. |
| 2007/0227901 | A1 | 10/2007 | Hu et al. |
| 2007/0244475 | A1 | 10/2007 | Carson et al. |
| 2007/0263356 | A1 | 11/2007 | Weber et al. |
| 2007/0274045 | A1 | 11/2007 | Campbell et al. |
| 2007/0297136 | A1 * | 12/2007 | Konshak ....................... 361/699 |
| 2008/0043440 | A1 | 2/2008 | Fedorov |
| 2008/0066889 | A1 | 3/2008 | Knight et al. |
| 2008/0105402 | A1 | 5/2008 | Behrens et al. |
| 2008/0115913 | A1 | 5/2008 | Henderson et al. |
| 2008/0137300 | A1 | 6/2008 | Macris et al. |
| 2008/0173432 | A1 | 7/2008 | Suy |
| 2008/0210405 | A1 | 9/2008 | Datta et al. |
| 2009/0032232 | A1 | 2/2009 | Murayama |
| 2009/0133866 | A1 * | 5/2009 | Campbell et al. ............. 165/288 |
| 2009/0268404 | A1 | 10/2009 | Chu et al. |
| 2010/0103620 | A1 | 4/2010 | Campbell et al. |
| 2010/0175854 | A1 | 7/2010 | Gratton |
| 2010/0277865 | A1 * | 11/2010 | Goth et al. ................ 361/679.53 |
| 2010/0314093 | A1 | 12/2010 | Refai-Ahmed et al. |
| 2011/0056225 | A1 * | 3/2011 | Campbell et al. ............. 62/208 |
| 2012/0111038 | A1 * | 5/2012 | Campbell et al. ............. 62/115 |
| 2012/0147553 | A1 * | 6/2012 | Eriksen ................... 361/679.53 |
| 2013/0027878 | A1 | 1/2013 | Campbell et al. |
| 2013/0027884 | A1 | 1/2013 | Campbell et al. |
| 2013/0068441 | A1 | 3/2013 | Campbell et al. |
| 2013/0070420 | A1 | 3/2013 | Campbell et al. |
| 2013/0077246 | A1 | 3/2013 | Campbell et al. |
| 2013/0077247 | A1 | 3/2013 | Campbell et al. |
| 2014/0044233 | A1 | 2/2014 | Campbell et al. |
| 2014/0048233 | A1 | 2/2014 | Campbell et al. |
| 2014/0048242 | A1 | 2/2014 | Campbell et al. |
| 2014/0049919 | A1 | 2/2014 | Campbell et al. |
| 2014/0096386 | A1 | 4/2014 | Campbell et al. |
| 2014/0096387 | A1 | 4/2014 | Campbell et al. |
| 2014/0326433 | A1 | 11/2014 | Kozubal |
| 2015/0036288 | A1 | 2/2015 | Campbell et al. |

OTHER PUBLICATIONS

Campbell et al., Office Action for U.S. Appl. No. 14/064,331, filed Oct. 28, 2013 (US. Patent Publication No. 2014/0048233 A1), dated Jan. 14, 2015 (14 pages).

Campbell et al., Notice of Allowance for U.S. Appl. No. 14/064,315, filed Oct. 28, 2013 (U.S. Patent Publication No. 2014/0049919 A1), dated Jan. 21, 2015 (12 pages).

Campbell et al., Notice of Allowance for U.S. Appl. No. 13/676,227, filed Nov. 14, 2012 (U.S. Patent Publication No. 2013/0068441 A1), dated Nov. 7, 2014 (11 pages).

Campbell et al., Notice of Allowance for U.S. Appl. No. 13/676,227, filed Nov. 14, 2012 (U.S. Patent Publication No. 2013/0070420 A1), dated Mar. 2, 2015 (9 pages).

David et al., "Vapor-Venting, Micromachined Heat Exchanger for Electronics Cooling", Proceedings of IMECE 2007, IMECE2007-42553 (Nov. 2007).

David et al., "Hydrodynamic and Thermal Performance of a Vapor-Venting Microchannel Copper Heat Exchanger", Proceedings of the 6th Int'l. ASME Conference on Nanochannels, Microchannels and Minichannels, ICNMM2008-62269 (Jun. 2008).

David et al., "Temperature-Dependent Permeability of Microporous Membranes for Vapor Venting Heat Exchangers", Proceedings of IMECE 2008, IMECE2008-67934 (Nov. 2008).

David et al., "Visualization and Analysis of Venting from a Single Microchannel Two-Phase Copper Heat Exchanger", Proceedings of the ASME 2009 InterPACK Conference, InterPACK2009-89192 (Jul. 2009).

Sung et al., "Single-Phase and Two-Phase Hybrid Cooling Schemes for High-Heat Flux Thermal Management of Defense Electronics", Journal of Electronic Packaging, vol. 131 (Jun. 2009).

Campbell et al., Notice of Allowance for U.S. Appl. No. 13/189,596, filed Jul. 25, 2011 (U.S. Patent No. 8,564,952 B2), dated Jun. 13, 2013 (12 pages).

Campbell et al., First Office Action for U.S. Appl. No. 13/676,227, filed Nov. 14, 2012 (U.S. Patent Publication No. 2013/0070420 A1), dated Nov. 5, 2013 (23 pages).

Campbell et al., Final Office Action for U.S. Appl. No. 13/676,227, filed Nov. 14, 2012 (U.S. Patent Publication No. 2013/0070420 A1), dated May 6, 2014 (18 pages).

Campbell et al., First Office Action for U.S. Appl. No. 13/189,597, filed Jul. 25, 20144 (U.S. Patent Publication No. 2013/0027878 A1), dated Jul. 11, 2013 (20 pages).

Campbell et al., Final Office Action for U.S. Appl. No. 13/189,597, filed Jul. 25, 20144 (U.S. Patent Publication No. 2013/0027878 A1), dated Dec. 27, 2013 (16 pages).

Campbell et al., Notice of Allowance for U.S. Appl. No. 13/189,597, filed Jul. 25, 20144 (U.S. Patent Publication No. 2013/0027878 A1), dated Mar. 14, 2014 (12 pages).

Campbell et al., Office Action for U.S. Appl. No. 13/676,242, filed Nov. 14, 2012 (U.S. Publication No. 2013/0077246 A1), dated Mar. 24, 2014 (14 pages).

Campbell et al., Office Action for U.S. Appl. No. 14/064,315, filed Oct. 28, 2013 (U.S. Patent Publication No. 2014/0049919 A1), dated Sep. 25, 2014 (16 pages).

Campbell et al., Office Action for U.S. Appl. No. 14/064,322, filed Oct. 28, 2013 (U.S. Patent Publication No. 2014/0048242 A1), dated Sep. 25, 2014 (20 pages).

(56) References Cited

OTHER PUBLICATIONS

Campbell et al., Office Action for U.S. Appl. No. 14/064,331, filed Oct. 28, 2013 (U.S. Patent Publication No. 2014/0048233 A1), dated Sep. 25, 2014 (15 pages).

Campbell et al., First Office Action for U.S. Appl. No. 13/189,598, filed Jul. 25, 2011 (U.S. Patent Publication No. 2013/0027884 A1), dated Dec. 13, 2013 (13 pages).

Campbell et al., Final Office Action for U.S. Appl. No. 13/189,598, filed Jul. 25, 2011 (U.S. Patent Publication No. 2013/0027884 A1), dated May 12, 2014 (12 pages).

Campbell et al., Notice of Allowance for U.S. Appl. No. 13/189,598, filed Jul. 25, 2011 (U.S. Patent Publication No. 2013/0027884 A1), dated Aug. 13, 2014 (9 pages).

Campbell et al., First Office Action for U.S. Appl. No. 13/676,313, filed Nov. 14, 2012 (U.S. Patent Publication No. 2013/0077247 A1), dated Jun. 5, 2014 (12 pages).

Campbell et al., Notice of Allowance for U.S. Appl. No. 13/676,313, filed Nov. 14, 2012 (U.S. Patent Publication No. 2013/0077247 A1), dated Sep. 11, 2014 (5 pages).

* cited by examiner

VALVE CONTROLLED, NODE-LEVEL VAPOR CONDENSATION FOR TWO-PHASE HEAT SINK(S)

CROSS-REFERENCE TO RELATED APPLICATION

This application is a continuation of U.S. Ser. No. 13/189,598, entitled "Valve Controlled, Node-Level Vapor Condensation for Two-Phase Heat Sink(s)," filed Jul. 25, 2011, published Jan. 31, 2012, as U.S. Patent Publication No. 2013/0027884 A1, and which is hereby incorporated herein by reference in its entirety.

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, a cooling apparatus is provided which includes: at least one heat sink to cool at least one electronic component of an electronic subsystem of multiple electronic subsystems of an electronics rack, the at least one heat sink comprising at least one coolant-carrying channel for a first coolant to flow therethrough, the first coolant providing two-phase cooling to the at least one electronic component, and being discharged from the at least one heat sink as coolant exhaust with coolant vapor; a node-level condensation module disposed within the electronic subsystem comprising the at least one electronic component, the node-level condensation module being coupled in fluid communication with the at least one heat sink and receiving the coolant exhaust therefrom, the node-level condensation module being liquid-cooled via a second coolant to facilitate condensing the coolant vapor in the received coolant exhaust within the electronic subsystem before return to a rack-level coolant return manifold of the electronics rack, the node-level condensation module comprising a liquid-to-liquid heat exchanger providing conductive heat transfer from the first coolant to the second coolant to facilitate condensing the first coolant vapor in the node-level condensation module; a controller automatically controlling at least one of the liquid-cooling of the at least one heat sink or the liquid-cooling of the node-level condensation module; and a control valve for adjusting a flow rate of the second coolant to the node-level condensation module, the control valve being automatically controlled by the controller based on a characterization of the coolant vapor in the coolant exhaust.

In another aspect, a cooled electronics apparatus is provided, which includes: an electronics rack comprising multiple electronic subsystems, one electronic subsystem of the multiple electronic subsystems comprising at least one heat-generating electronic component to be cooled; and a cooling apparatus for cooling the at least one heat-generating electronic component. The cooling apparatus includes: at least one heat sink coupled to the at least one heat-generating electronic component, the at least one heat sink comprising at least one coolant-carrying channel for a first coolant to flow therethrough, the first coolant providing two-phase cooling to the at least one electronic component and being discharged from the at least one heat sink as coolant exhaust with coolant vapor; a node-level condensation module disposed within the electronic subsystem comprising the at least one heat-generating electronic component, the node-level condensation module being coupled in fluid communication with the at least one heat sink and receiving the coolant exhaust therefrom, the node-level condensation module being liquid-cooled via a second coolant to facilitate condensing the coolant vapor in the received coolant exhaust within the electronic subsystem before return to a rack-level coolant return manifold of the electronics rack, the node-level condensation module comprising a liquid-to-liquid heat exchanger providing conductive heat transfer from the first coolant to the second coolant to facilitate condensing of the first coolant vapor in the node-level condensation module; a controller automatically controlling at least one of the liquid-cooling of the at least one heat sink or the liquid-cooling of the node-level condensation module; and a rack-level control valve for directing fractions of the second coolant to the node-level condensation module and to a rack-level coolant conditioning unit coupled to receive the coolant exhaust from the rack-level coolant return manifold, the rack-level control valve being automatically controlled by the controller to adjust the fraction of the second coolant flowing to the node-level condensation module based on a characterization of the coolant vapor in the coolant exhaust.

Additional features and advantages are realized through the techniques of the present invention. Other embodiments and aspects of the invention are described in detail herein and are considered part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
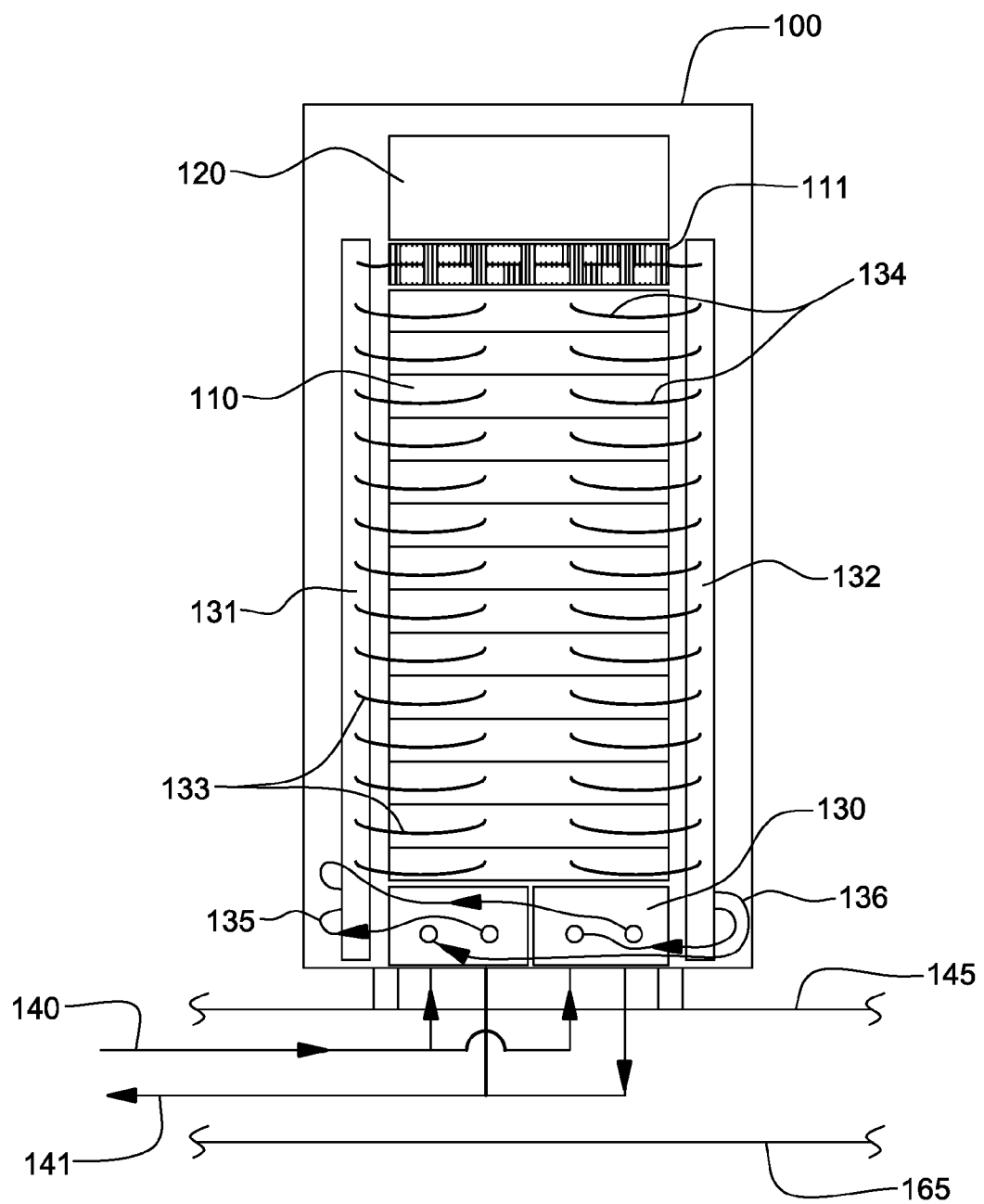
FIG. 1 is an elevational view of one embodiment of a liquid cooled electronics rack comprising one or more heat-generating electronic components, and employing one or more heat sinks, in accordance with one or more aspects of the present invention.

As used herein, the terms "electronics rack" and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or sub-systems) of an electronics rack to be cooled.

"Electronic component" refers to any heat generating electronic component of, for example, a computer system or other electronic system requiring cooling. By way of example, an electronic component may comprise one or more integrated circuit dies, chips, modules and/or other heat-generating electronic devices to be cooled, such as one or more processors, memory modules and/or memory support structures. Further, as used herein, the terms "heat sink" and "coolant cooled heat sink" refer to thermally conductive structures having one or more channels (or passageways) form therein or passing therethrough, which facilitate the flow of coolant through the structure. One example, the coolant carrying channels comprise microchannels having a characteristic dimension of 1.0 mm or less, for example, in the range of approximately 0.1 mm to 0.5 mm.

As used herein, "liquid-to-liquid heat exchanger" may comprise, for example, two or more coolant flow paths, formed of thermally conductive tubings (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

By way of example, the first coolant and the second coolant discussed herein are a system (or working) coolant, and a facility (or house coolant), respectively. In one specific example, the system coolant and the facility coolant are water. However, the concepts disclosed herein are readily adapted to use with other types of coolant on the facility side and/or on the system side. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

FIG. 1 depicts one embodiment of a liquid-cooled electronics rack 100 which employs a liquid-based cooling system. In one embodiment, liquid-cooled electronics rack 100 comprises a plurality of electronic subsystems or nodes 110, which may comprise processor or server nodes, as well as a disk enclosure structure 111. In this example, a bulk power assembly 120 is disposed at an upper portion of liquid-cooled electronics rack 100, and two modular cooling units (MCUs) 130 are disposed in a lower portion of the liquid-cooled electronics rack. In the embodiments described herein, the coolant is assumed to be water or an aqueous-based solution, again, by way of example only.

In addition to MCUs 130, the cooling system includes a system water supply manifold 131, a system water return manifold 132, and manifold-to-node fluid connect hoses 133 coupling system water supply manifold 131 to electronics structures 110, 111 and node-to-manifold fluid connect hoses 134 coupling the individual electronics subsystems 110, 111 to system water return manifold 132. Each MCU 130 is in fluid communication with system water supply manifold 131 via a respective system water supply hose 135, and each MCU 130 is in fluid communication with system water return manifold 132 via a respective system water return hose 136.

As illustrated, heat load of the electronic structures is transferred from the system water to cooler facility water supplied by facility water supply line 140 and facility water return line 141 disposed, in the illustrated embodiment, in the space between a raised floor 145 and a base floor 165.

Figure 2:
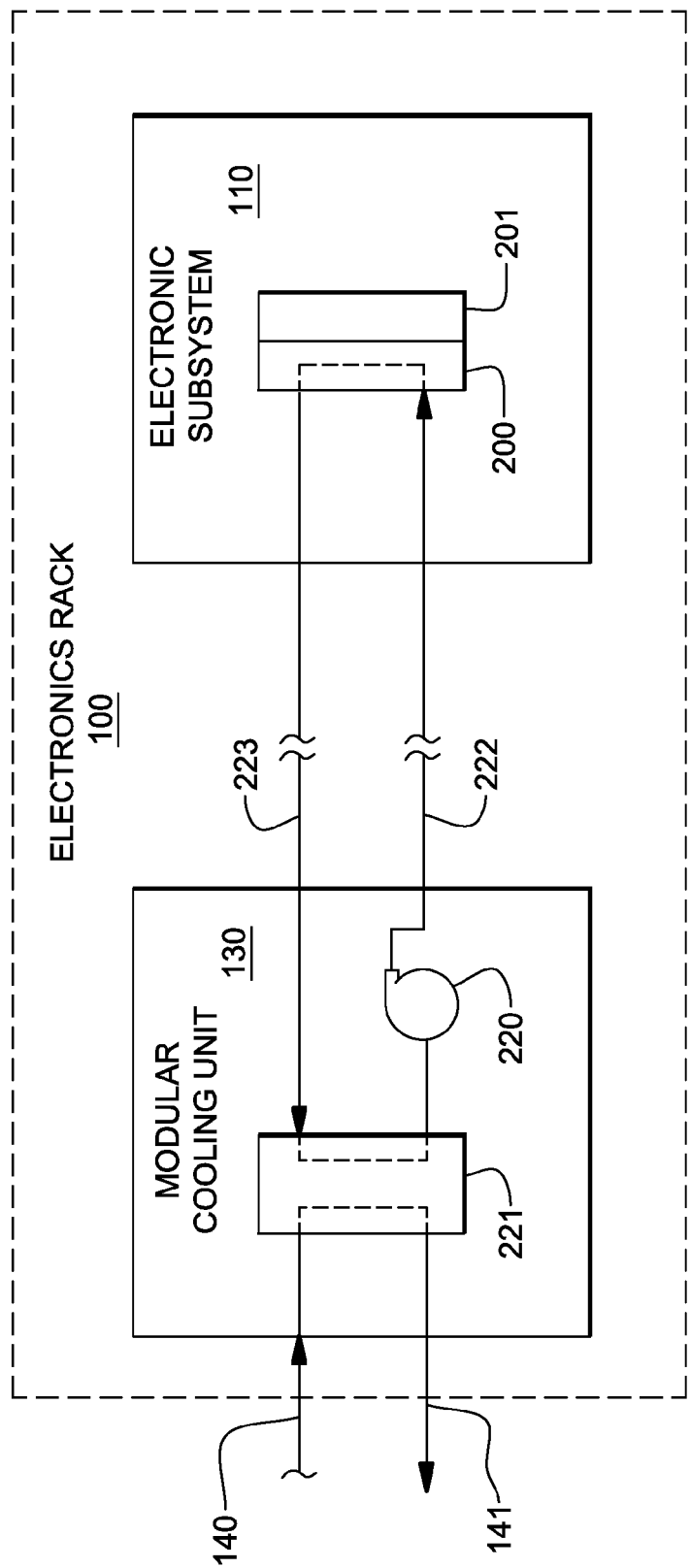
FIG. 2 is a schematic of one embodiment of an electronic subsystem or node of an electronics rack, wherein an electronic component and associated heat sink are cooled by system coolant provided by one or more modular cooling units disposed within the electronics rack, in accordance with one or more aspects of the present invention.

FIG. 2 schematically illustrates operation of the cooling system of FIG. 1, wherein a liquid-cooled heat sink 200 is shown coupled to an electronic component 201 of an electronic subsystem 110 within the electronics rack 100. Heat is removed from electronic component 201 via the system coolant circulated via pump 220 through heat sink 200 within the system coolant loop defined by liquid-to-liquid heat exchanger 221 of modular cooling unit 130, lines 222, 223 and heat sink 200. The system coolant loop and modular cooling unit are designed to provide coolant of a controlled temperature and pressure, as well as controlled chemistry and cleanliness to the electronic component(s). Furthermore, the system coolant is physically separate from the less controlled facility coolant in lines 140, 141, to which heat is ultimately transferred.

Figure 3:
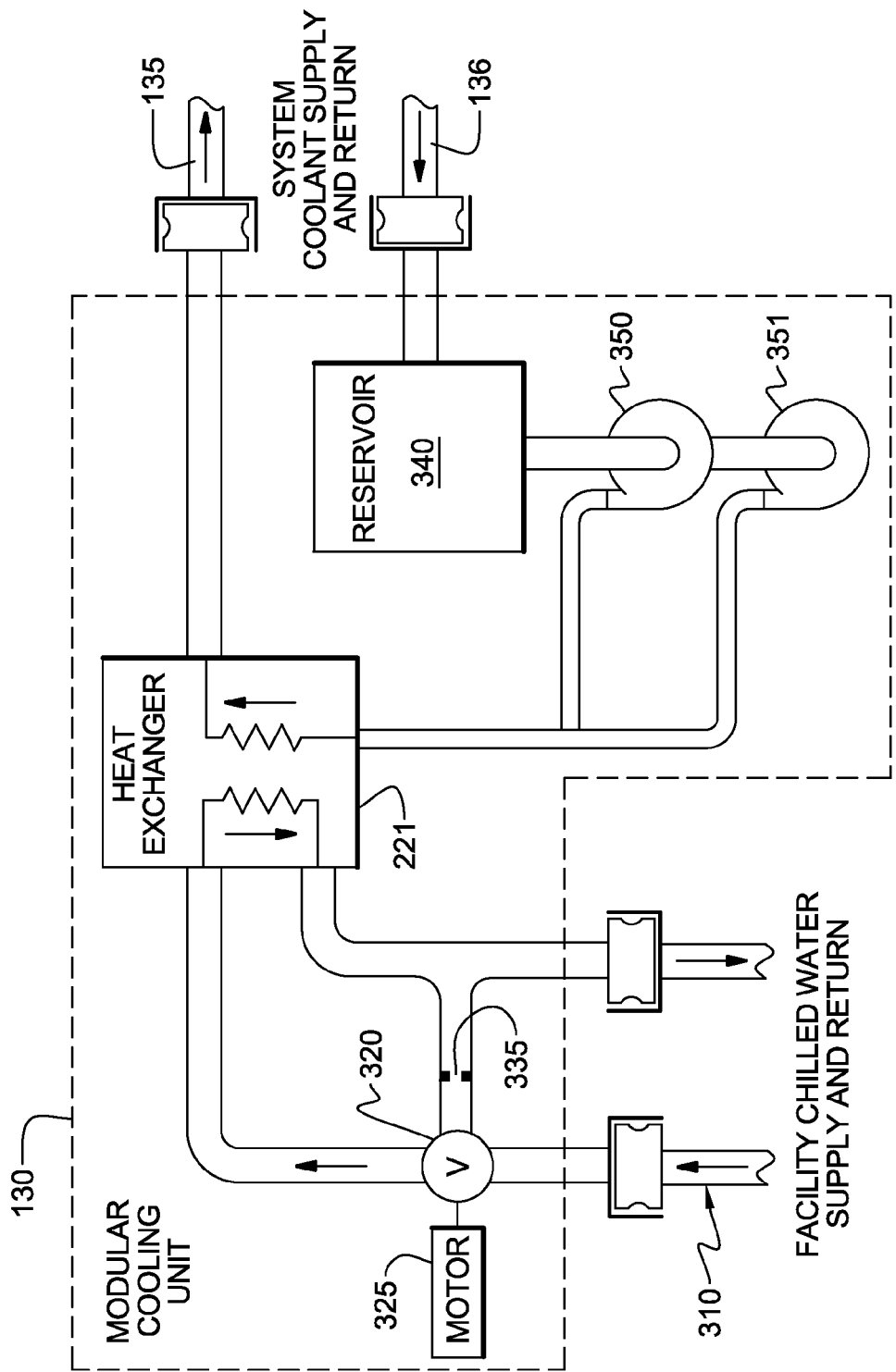
FIG. 3 is a schematic of one embodiment of a modular cooling unit for a cooled electronics rack such as depicted in FIGS. 1 & 2, in accordance with one or more aspects of the present invention.

FIG. 3 depicts a more detailed embodiment of a modular cooling unit 130, in accordance with an aspect of the present invention. As shown in FIG. 3, modular cooling unit 130 includes a facility coolant loop wherein building chilled, facility coolant is supplied 310 and passes through a control valve 320 driven by a motor 325. Valve 320 determines an amount of facility coolant to be passed through liquid-to-liquid heat exchanger 221, with a portion of the facility coolant possibly being returned directly via a bypass orifice 335. The modular cooling unit further includes a system coolant loop with a reservoir tank 340 from which system coolant is pumped, either by pump 350 or pump 351, into the heat exchanger 221 for conditioning and output thereof, as cooled system coolant to the associated rack unit to be cooled. The cooled system coolant is supplied to the system supply manifold and system return manifold of the liquid-cooled electronics rack via the system water supply hose 135 and system water return hose 136.

Figure 4:
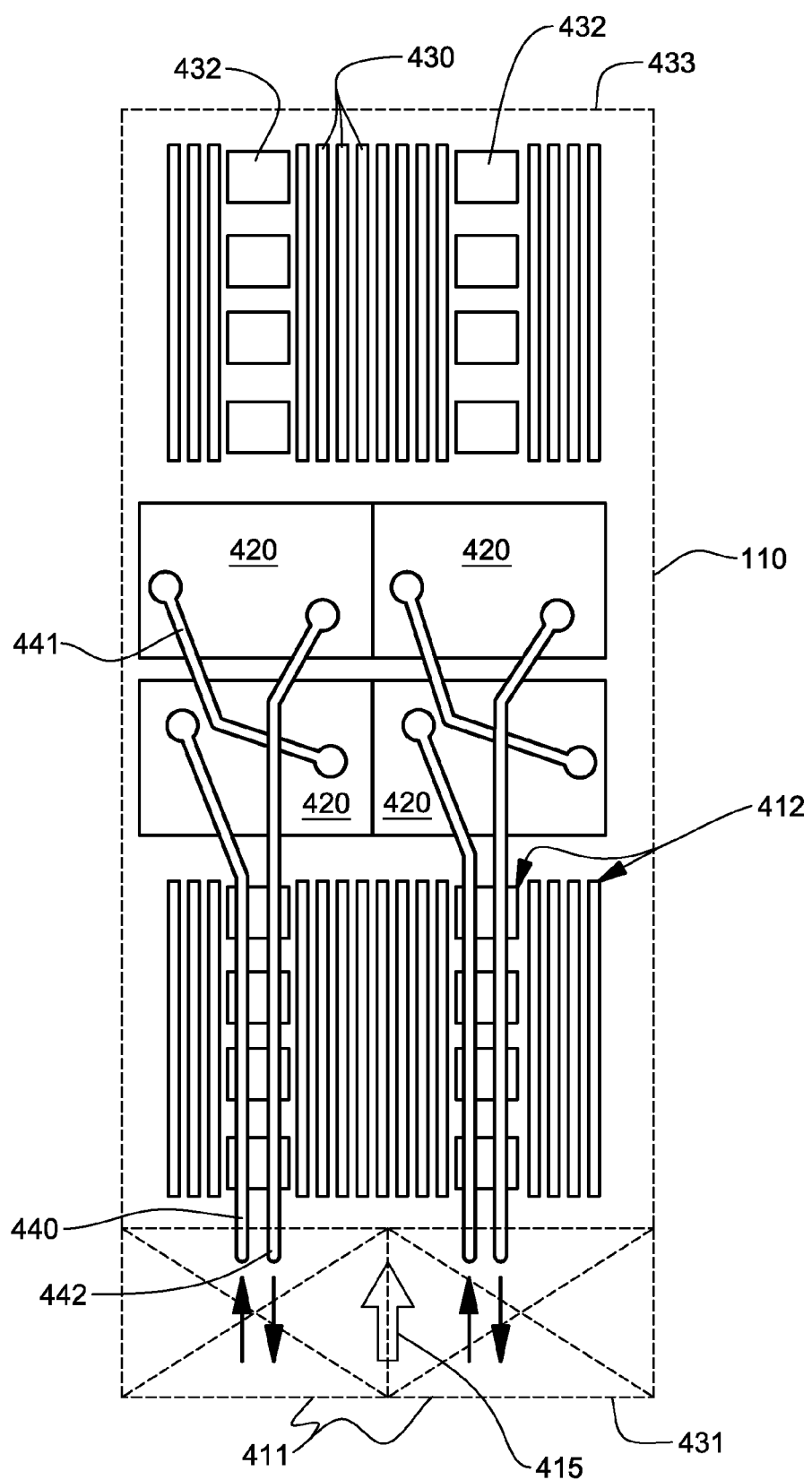
FIG. 4 is a plan view of one embodiment of an electronic subsystem layout illustrating multiple heat sinks cooling multiple electronic components of the electronic subsystem, in accordance with one or more aspects of the present invention.

FIG. 4 depicts one embodiment of an electronic subsystem 110 layout wherein one or more air moving devices 411 provide forced air flow 415 to cool multiple devices 412 within electronic subsystem 110. Cool air is taken in through a front 431 and exhausted out a back 433 of the drawer. The multiple devices to be cooled include multiple processor modules to which coolant-cooled heat sinks 420 (of a cooling system) are coupled, as well as multiple arrays of memory modules 430 (e.g., dual in-line memory modules (DIMMs)) and multiple rows of memory support modules 432 (e.g., DIMM control modules) to which air-cooled heat sinks are coupled. In the embodiment illustrated, memory modules 430 and the memory support modules 432 are partially arrayed near front 431 of electronic subsystem 110, and partially arrayed near back 433 of electronic subsystem 110. Also, in the embodiment of FIG. 4, memory modules 430 and memory support modules 432 are cooled by air flow 415 across the electronic subsystem.

The illustrated liquid-based cooling system further includes multiple coolant-carrying tubes connected to and in fluid communication with coolant-cooled heat sinks 420. The coolant-carrying tubes comprise sets of coolant-carrying tubes, with each set including (for example) a coolant supply tube 440, a bridge tube 441 and a coolant return tube 442. In this example, each set of tubes provides liquid coolant to a series-connected pair of heat sinks 420 (coupled to a pair of processor modules). Coolant flows into a first heat sink of each pair via the coolant supply tube 440 and from the first heat sink to a second heat sink of the pair via bridge tube or line 441, which may or may not be thermally conductive. From the second heat sink of the pair, coolant is returned through the respective coolant return tube 442. In an alternate implementation, tubing is provided for separately passing coolant in parallel through the heat sinks of the electronic subsystem.

In one embodiment, the above-described cooling system can be employed with single-phase liquid-cooling. However, such a system requires a large liquid flowrate, and correspondingly large, high-power pumps, to avoid the liquid boiling and minimize sensible heating of the fluid as it absorbs the heat dissipated. The flowrate and pump power required may be reduced by an order of magnitude by leveraging the large latent heat of vaporization, allowing the liquid to boil. Flow boiling provides high heat transfer coefficients, which can facilitate reducing the junction-to-ambient module thermal resistance, and can couple the module temperature to the boiling point of the coolant (or working fluid), resulting in better temperature uniformity.

However, flow boiling in the confined flow geometries of small heat sink channels, and small impingement jets in the heat sink, result in a detrimental rise in pressure due to bubble nucleation, bubble growth and advection of the vapor phase. The rise in pressure shifts saturation conditions, delaying the onset of boiling, and also results in the development of flow instabilities and flow maldistribution at the heat sink and node level, which can lead to premature liquid dryout. These issues have made flow boiling microstructures difficult to implement.

As used herein, a "microchannel", "micro-jet" or "microstructure" refers to a structure having a characteristic dimension less than 1.0 mm, for example, of approximately 0.5 mm or less. In one implementation, the microchannel has a characteristic dimension of approximately 100 microns, and the jet channel (or jet orifice) has a diameter less than 100 microns. In the implementations described herein, the jet orifice diameter is assumed to be less than the microchannel width, since the jet orifice injects coolant into the microchannel(s) of the heat sink.

Disclosed hereinbelow are various heat sink structures which combine local jet impingement of coolant (through jet nozzles (or jet orifices)) with local vapor removal via a porous, vapor-permeable membrane, which minimizes the various challenges encountered during flow boiling in microstructures. The microchannels provide a larger heat transfer area and improved thermal performance as compared to larger, conventional channels, and by incorporating a vapor-permeable membrane within the heat sink structure, vapor generated within the microchannels can escape the confined microchannel geometry directly into a separate vapor transport channel/plenum. This local removal of vapor provides several advantages, including: a reduced two-phase flow pressure drop and a reduced required pumping power for circulating coolant through the heat sink structure(s); a lower and more uniform coolant saturation temperature within the heat sink structure; an improved heat transfer coefficient and reduced heat sink thermal resistance due to phase change; improved wetting and improved jet impingement; and a reduced possibility of flow instabilities which might lead to premature dryout within the heat sink.

The separated vapor can be reintroduced into the coolant exhaust from the cooling microchannels within the heat sink structure itself, or at a node level within an electronics rack comprising the heat sink structure. As described herein, the coolant vapor is advantageously condensed at the electronic subsystem (or node level) through either direct contact condensation with a diverted fraction of the sub-cooled coolant employed within the heat sink(s), or indirect condensation using a facility chilled coolant, such as facility chilled water, that is plumbed to the node-level condensation module (i.e., condenser). The vapor is condensed back to liquid, and rejoins the liquid coolant returning to the modular cooling unit, where the liquid can be cooled and pumped back to the nodes of the electronics rack. In one embodiment, the coolant flowing through the heat sink structures comprises water, and the membrane is a porous, hydrophobic membrane. Further, in one embodiment, the membrane may be modified to have a spatially-varying porosity and stiffness, which allows for both the injection of fluid, through jet orifices provided in rigid portions of the membrane, and local removal of vapor generated within the microchannels. Alternatively, a plate mask could be associated with the vapor-permeable region of the membrane to define a multilayer structure, which comprises one or more coolant injection regions and one or more vapor removal regions from the microchannels. Note that in the embodiments described herein, the membrane, or the membrane and plate mask structure, overlie and form part of the coolant-carrying channels so as to be exposed to vapor within the coolant-carrying channels of the heat sink. For example, in one embodiment, the membrane forms a top portion of each of the coolant-carrying channels of the heat sink.

FIGS. 5A-5D depict one embodiment of a cooled electronic structure, generally denoted 500, in accordance with one or more aspects of the present invention. Cooled electronic structure 500 includes, in this embodiment, an electronic component 510, such as an electronic module, mounted to a printed circuit board 501 with an associated back plate 502 (for example, a metal back plate). A heat sink 503 is mechanically coupled via securing mechanisms 505 to back plate 502 of printed circuit board 501, which provide a compressive load forcing heat sink 503 in good thermal contact with electronic component 510. Electronic component 510 includes, in this embodiment, an integrated circuit chip 511 connected to a chip carrier or substrate 513 via, for example, a first plurality of solder ball connections 512. Similarly, substrate 513 is electrically connected to printed circuit board 501 via, for example, a second plurality of solder ball connections 514. A thermally conductive cap 516 is interfaced to integrated circuit chip 511 via a first thermal interface material 515, such as a silicone-based paste or grease, pad, epoxy or solder. A second thermal interface material 517 facilitates thermal interfacing of cap 516 to heat sink 503.

Figure 5A:
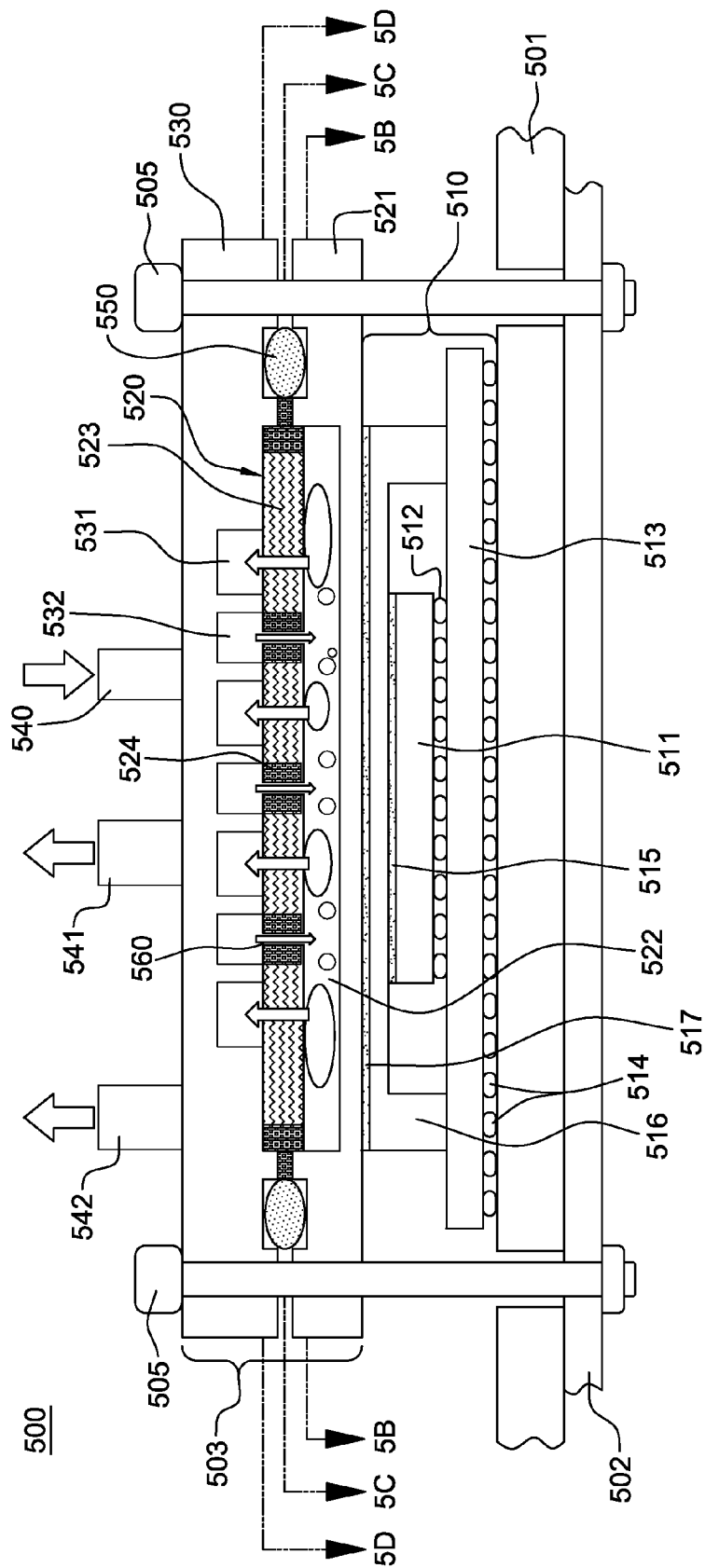
FIG. 5A is a cross-sectional elevational view of one embodiment of a cooled electronic structure comprising a heat-generating electronic component and a heat sink with a vapor-permeable membrane, and taken along lines 5A-5A in FIGS. 5B & 5D, in accordance with one or more aspects of the present invention.
Figure 5B:
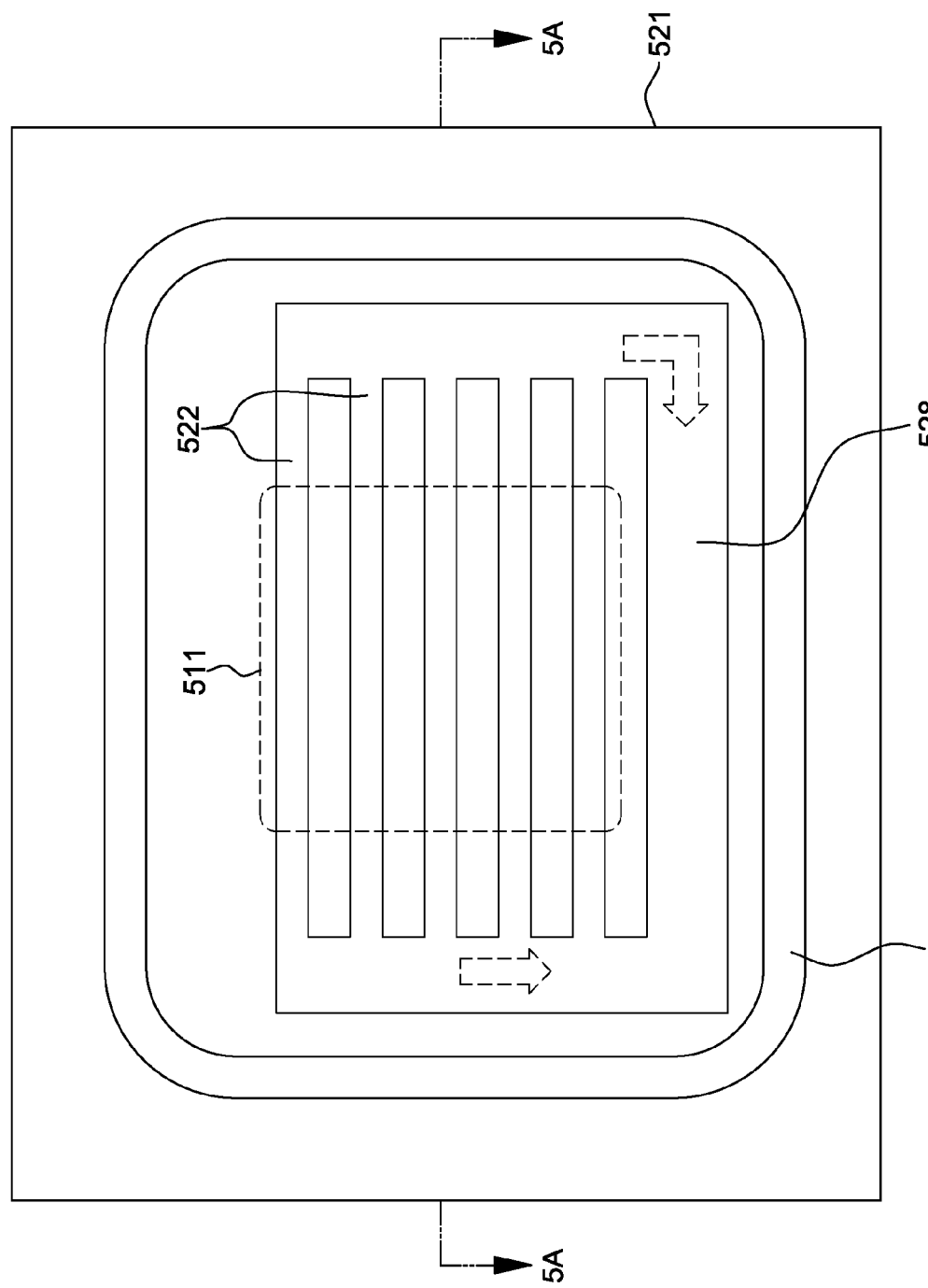
FIG. 5B is a cross-sectional plan view of the cooled electronic structure of FIG. 5A, taken along line 5B-5B thereof, in accordance with one or more aspects of the present invention.
Figure 5C:
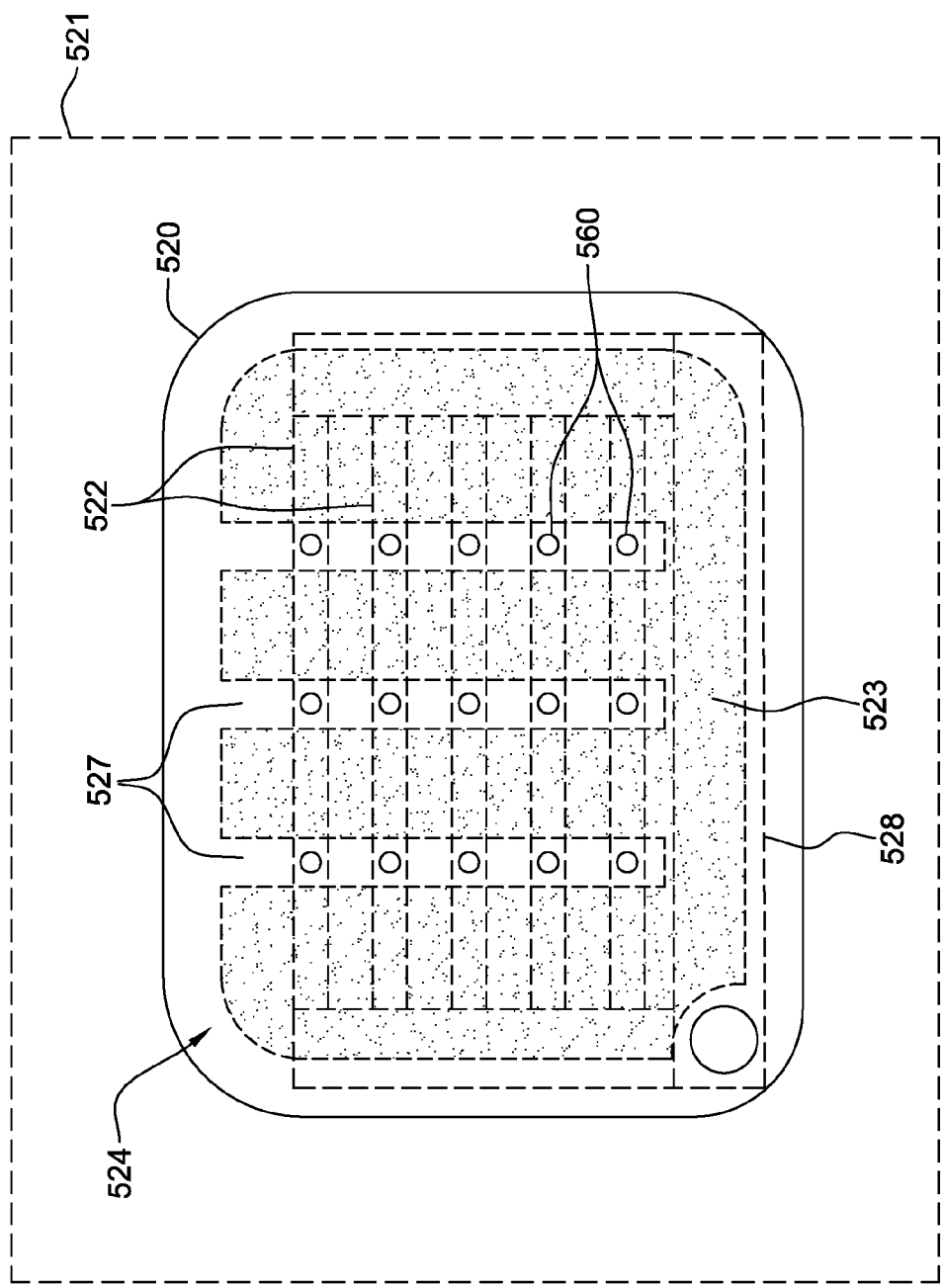
FIG. 5C is a cross-sectional plan view of the cooled electronic structure of FIG. 5A, taken along line 5C-5C thereof, in accordance with one or more aspects of the present invention.
Figure 5D:
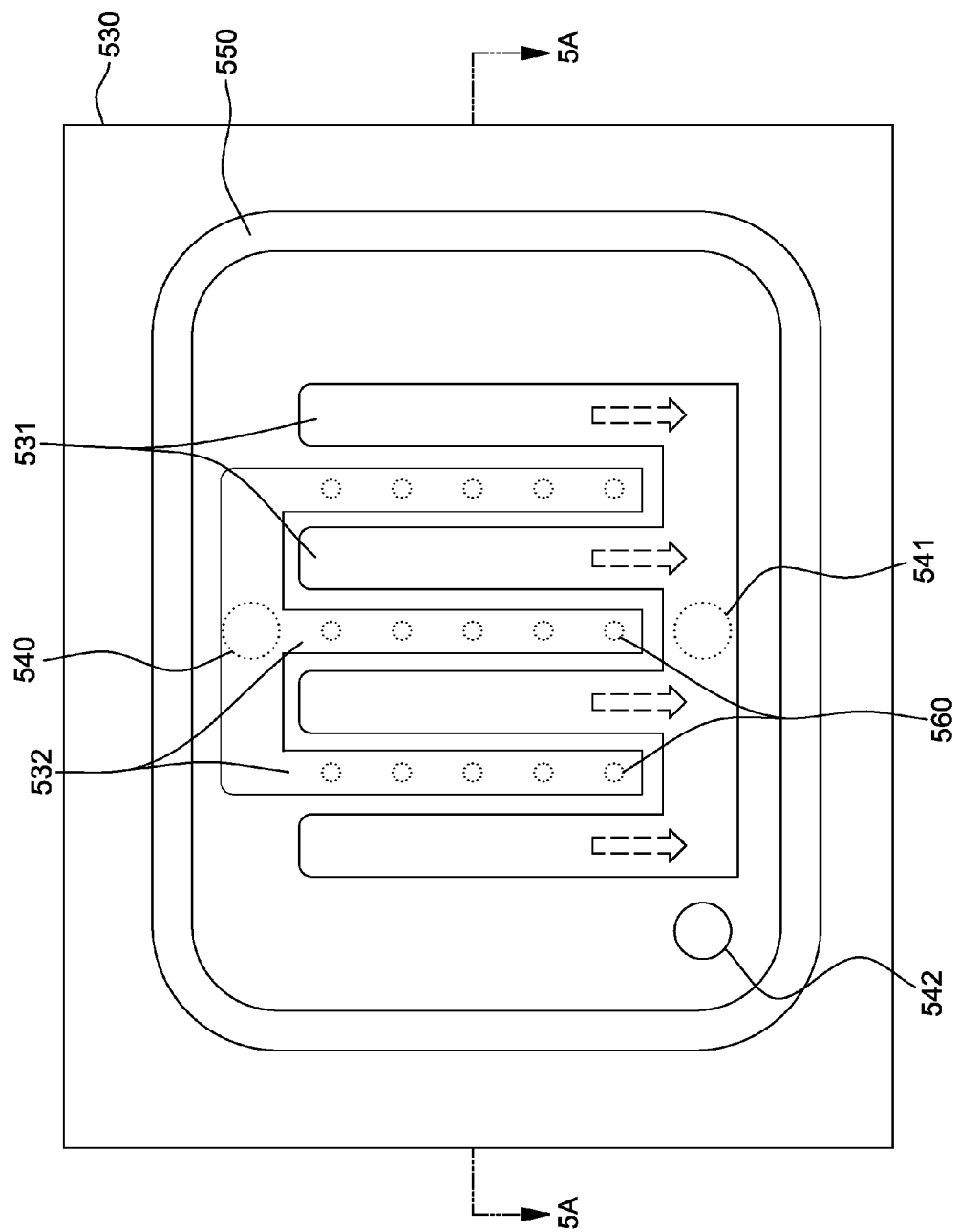
FIG. 5D is a cross-sectional plan view of the cooled electronic structure of FIG. 5A, taken along line 5D-5D thereof, in accordance with one or more aspects of the present invention.

In this embodiment, heat sink 503 comprises a multilayer heat sink with a heat sink base 521, a membrane structure 520 and a heat sink cap 530, which are respectively depicted in cross-sectional plan view in FIGS. 5B-5D. Referring collectively to FIGS. 5A-5D, heat sink base 521 comprises one or more coolant-carrying channels 522, each of which may comprise a microchannel structure, such as described above. Note that five coolant-carrying microchannels are depicted in FIG. 5B, by way of example only. More or less coolant-carrying channels may be defined within the heat sink base, as desired. Heat from the electronic component is rejected to coolant within the coolant-carrying channels in the heat sink base. Two-phase cooling of the heat-generating electronic component is achieved by at least partial vaporization of the coolant (i.e., working fluid) within the one or more coolant-carrying channels of the heat sink.

As illustrated in FIGS. 5A & 5C, various regions of the coolant-carrying channels are capped by at least one vapor-permeable region 523 of membrane structure 520. As illustrated in FIGS. 5A & 5D, disposed over these regions are vapor transport channels 531 formed in heat sink cap 530. Thus, localized venting of vapor directly from the coolant-carrying channels, across the vapor-permeable membrane into the vapor transport channels is provided within the heat sink. In one embodiment, membrane 520 is modified to include, in addition to at least one vapor-permeable region 523, at least one vapor-impermeable region 524. In one embodiment, the at least one vapor-impermeable region 524 comprises a plurality of parallel-extending digits 527 that are interdigitated with a plurality of vapor-permeable areas of the at least one vapor-permeable region 523, as illustrated in FIG. 5C. The vapor-impermeable digits extend substantially transverse to the coolant-carrying channels 522.

In the embodiment depicted, at least one orifice 560 is provided in each of the vapor-impermeable digits where extending over a respective coolant-carrying channel. Coolant is introduced into the coolant-carrying channels through orifices 560 via liquid coolant delivery channels 532 in fluid communication with a liquid coolant inlet 540 of heat sink 503. Coolant exhaust is discharged via coolant exhaust channels 528 extending through an opening in the membrane 520 into heat sink cap 530. Coolant exhaust channels 528 are in fluid communication with a coolant exhaust outlet port 542 of heat sink 503. In this embodiment, the vapor transfer channels 531 vent vapor from the heat sink through vapor outlet port 541, and thus, both a two-phase liquid-vapor mixture and vapor are exhausted (in one embodiment) from the heat sink(s). Note that in this embodiment, the orifices 560 in the vapor-impermeable digits of the membrane are jet orifices, which provide jet impingement of coolant into the respective coolant-carrying channels of the heat sink and onto a surface of the respective coolant-carrying channel. Note also that, in this embodiment, a liquid coolant inlet port, a coolant exhaust outlet port, and a vapor exhaust port are provided in the heat sink.

As illustrated in FIGS. 5B & 5D, heat sink base 521 and heat sink cap 530 are configured to accommodate an O-ring 550 to seal coolant within the heat sink. Liquid coolant and vapor are additionally sealed within the heat sink by vapor and liquid-impermeable region 524, which is provided to extend around the perimeter of the membrane, that is, where held by the heat sink base and heat sink cap as illustrated in FIG. 5A.

In one embodiment, the heat sink base and heat sink cap are fabricated of a metal material, such as copper, the coolant comprises water, and the membrane is a porous hydrophobic membrane, such as a vapor-permeable PTFE or polypropylene material, such as the membranes available, for example, from Sterlitech Corp., of Kent, Wash., USA, or Sumitomo Electric Interconnect Products, Inc., of San Marcos, Calif., USA.

Figure 6:
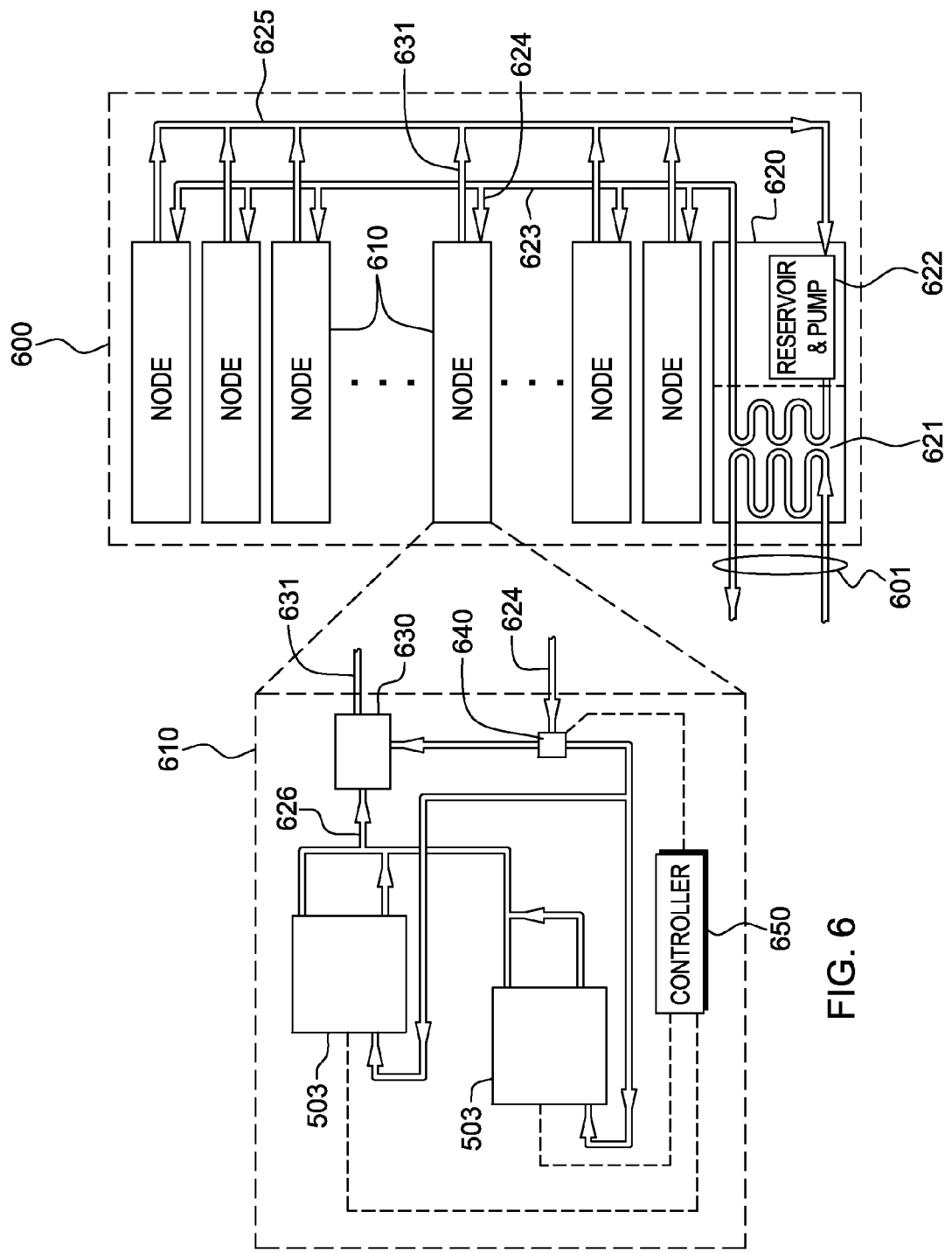
FIG. 6 is a schematic one embodiment of a cooled electronics apparatus comprising an electronic subsystem or node with multiple heat sinks and illustrating controlled node-level vapor condensing, in accordance with one or more aspects of the present invention.

FIG. 6 depicts one embodiment of a cooled electronics apparatus comprising a rack-level cooling apparatus with multiple heat sink structures, such as depicted in FIGS. 5A-5D. In this embodiment, two heat sink structures 503 are illustrated within an electronic subsystem or node 610 of an electronics rack 600. The cooling apparatus includes a modular cooling unit 620, such as described above. Modular cooling unit 620 includes a liquid-to-liquid heat exchanger 621 and a reservoir with an associated pump 622 for providing cooled liquid coolant via a coolant supply manifold 623 and node-level supply lines 624 to the coolant inlet ports of the respective heat sinks 503. In the embodiment of FIGS. 5A-5D, the vented coolant vapor is output from the heat sink separate from the coolant exhaust and is combined outside the heat sink in a single coolant exhaust line 626 extending to a node-level condensation module 630, which is configured and controlled to condense coolant vapor in the exhausting coolant received via coolant exhaust line 626. The output of node-level condensation module 630 is provided, via a node-level return line 631, to a rack-level coolant return manifold 625, which returns the warm liquid coolant to the modular cooling unit 620, to repeat the process. As illustrated in FIG. 6, heat exchanger 621 comprises (in one embodiment) a liquid-to-liquid heat exchanger, with a facility coolant loop 601 providing facility coolant to the liquid-to-liquid heat exchanger 621. In the embodiment of FIG. 6, each electronic subsystem (or node) comprises a respective node-level condensation module 630, which (in the embodiment depicted), is liquid-cooled via a portion of the cooled coolant (or working fluid) received via the node-level coolant supply line 624. In this embodiment, a three-way control valve 640, controlled by a controller 650, divides (in one embodiment) the cooled coolant flow received via node-level coolant supply line 624 between the node-level condensation module 630 and the heat sinks 503. One control process implemented by controller 650 for controlling control valve 640 is depicted in FIG. 7.

Figure 7:
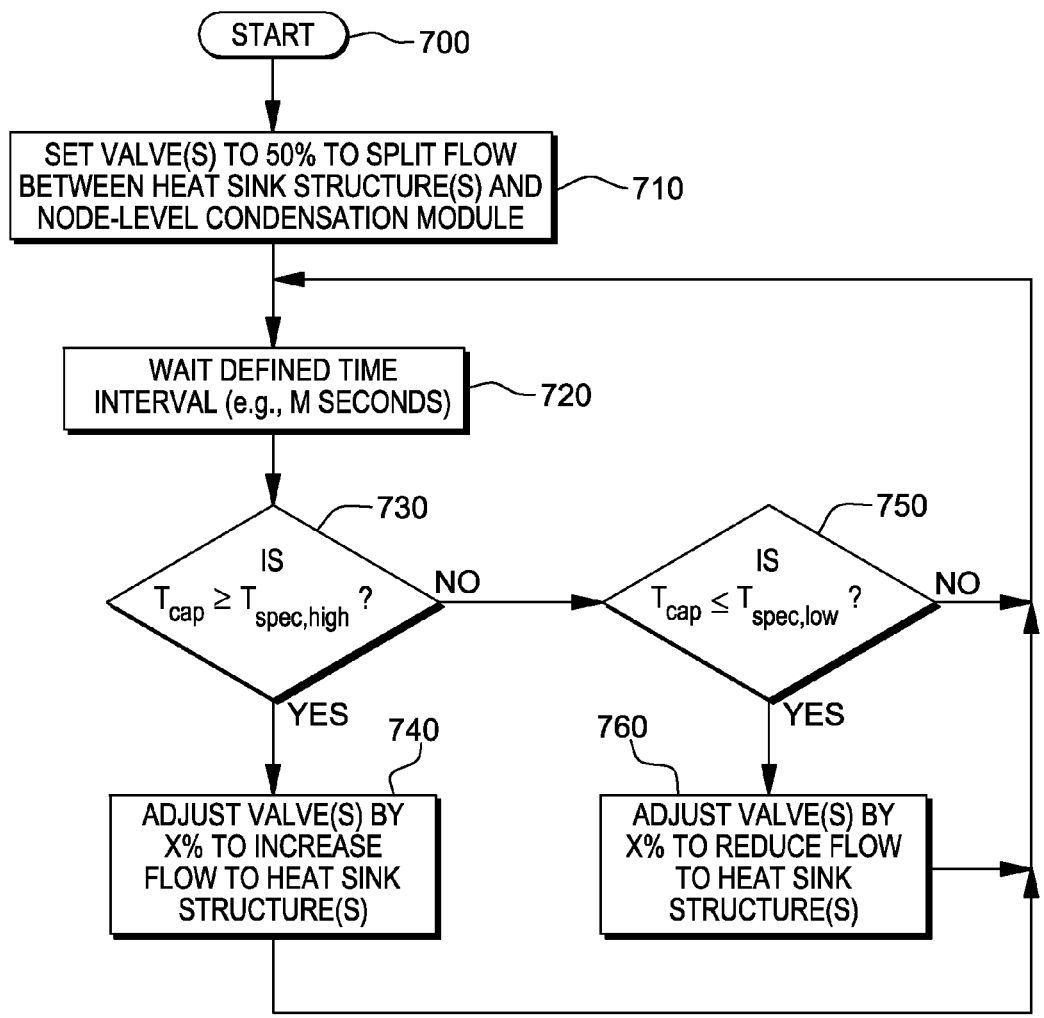
FIG. 7 depicts one embodiment of a control process for adjusting coolant flow between one or more heat sink structures and the node-level condensation module within a cooled electronics apparatus such as depicted in FIGS. 5A-6, in accordance with one or more aspects of the present invention.

FIG. 7 depicts one embodiment of a control process for controlling the control valve(s) in a dynamically adjustable control valve (e.g., electronic valve) implementation such as depicted in FIG. 6. Processing starts 700 by setting (in one embodiment) the valve(s) to a 50% split of the cooled coolant flow between the heat sink structures and the node-level condensation module 710. Processing waits a predefined time, such as M seconds 720, before determining whether the temperature of the cap ($T_{cap}$) of one or more associated electronic component(s) monitored by the controller is greater than a specified high temperature threshold ($T_{spec,high}$) 730. Note that this embodiment assumes that one or more temperature sensors are associated with the respective electronic component(s) of the associated cooled electronic structure, and that the sensed temperatures are fed back to the respective controller 650, which (in one embodiment) may be a node-level controller or a rack-level controller (see FIG. 6). If "yes", then the valve is adjusted to increase (for example, by a set percentage (X %)) the coolant flow to the coolant-carrying channels in the heat sink structure(s) 740 to provide greater cooling to the electronic component. Processing then waits the predefined time interval (e.g., M seconds) 720 before again evaluating the cap temperature ($T_{cap}$). If the cap temperature ($T_{cap}$) is less than the specified high temperature threshold ($T_{spec,high}$), then processing determines whether the cap temperature ($T_{cap}$) is less than or equal to a specified low temperature threshold ($T_{spec,low}$) 750. If "yes", then the control valve is automatically adjusted (for example, by the predefined percentage (X %)) to reduce the flow of coolant to the coolant-carrying channels in the heat sink structure(s) 760. Thereafter, processing waits the defined time interval 720 before repeating the process.

Note that having the ability to adjust the ratio as needed allows the vapor quality in the cooling channels of the heat sink structures to be controlled and provides a more uniform heat transfer coefficient and pressure drop as the thermal loads vary. This assists in reducing two-phase instabilities from forming in the rack as different nodes experience different thermal loads. Initially, the cooled coolant may be split equally between the heat sink structures and the condensation module, but if the temperature of one of the electronic components is below a lower specified limit, then less flow is diverted to the modules, and more to the condenser. The advantage of this change is a reduction in the pressure drop in the node due to a lowering of the flowrate through the small-diameter cooling microchannels. If the electronic component temperature is found to be too high, for example, above an upper specified temperature limit, indicating lack of sufficient flow or too high of a vapor quality (which reduces the heat transfer coefficient), then the valve is adjusted to divert more coolant flow to the heat sink structures, and less to the condensation module. This assists in reducing the amount of vapor generated in the microchannels, and reduces the electronic component temperatures.

Figure 8:
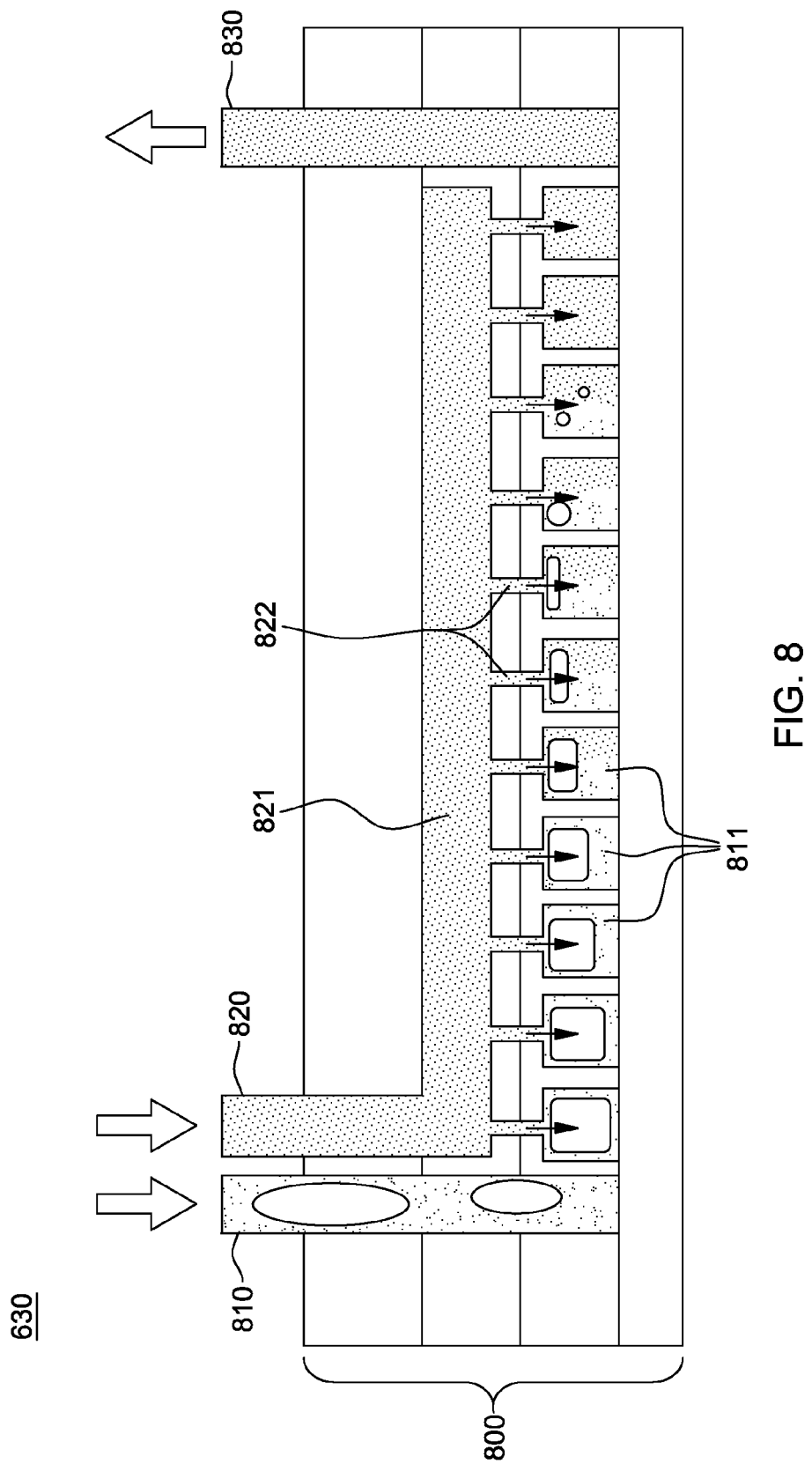
FIG. 8 is a schematic of one embodiment of a direct-cooled, node-level condensation module employed, by way of example, in the cooled electronics apparatus of FIG. 6, in accordance with one or more aspects of the present invention.

As noted, in one embodiment, node-level condensation module 630 implements direct-contact condensing using a diverted fraction of the sub-cooled coolant received via node-level supply line 624 at the respective liquid-cooled node of the electronics rack 600. One embodiment of such a direct-contact, node-level condensation module is depicted in FIG. 8. In this embodiment, node-level condensation module 630 comprises a multi-layer structure 800, which may be fabricated of a thermally conductive material, such as copper or aluminum. The layers are configured to provide a node-level condensation module wherein there is direct mixing between the two-phase, liquid-gaseous mixture received via coolant exhaust line 626 (see FIG. 6) at a first inlet 810 of node-level condensation module 630 and the sub-cooled coolant received via control valve 640 (FIG. 6) and node-level coolant supply line 624 at a second inlet 820 of the condensation module. As used herein, sub-cooled refers to some temperature below the saturation temperature of the liquid at a given pressure. In this embodiment, the condensation module comprises one or more parallel (or serpentine) condensing channels 811, through which the coolant exhaust passes. In the embodiment illustrated, node-level condensation module 630 further includes one or more parallel (or serpentine) channels or an open chamber 821, with orifices 822, through which the cooled liquid coolant flows into the one or more condensing channels 811 to impinge and mix with the coolant exhaust received via first inlet 810. As illustrated, the percentage of coolant vapor within the coolant exhaust drops as the coolant exhaust flows through the one or more condensing channels 811 and is mixed with the cooled coolant received into the channels via orifices 822. The resultant warm, single-phase liquid coolant exhaust is output via an outlet 830 and node-level coolant return line 631 to the rack-level return manifold 625, for return to the modular cooling unit 620, to repeat the process.

Referring collectively to FIGS. 5A-8, operationally, at low heat fluxes, coolant impinges on the coolant-carrying channel surfaces of the heat sink base and flows down the coolant-carrying channels thereof as a single-phase liquid to the coolant exhaust plenum at either end of the channels. The liquid-impermeable nature of the vapor-permeable membrane stops the liquid from leaking from the coolant-carrying channels through the pores of the membrane into the vapor transport channels in the heat sink cap. The liquid impingement has a higher heat transfer coefficient, and the relatively shorter flow lengths facilitate reducing flow pressure drop, and may maintain better temperature uniformity compared with coolant delivered parallel to the heated surface. The liquid flows to the external cooling apparatus (as shown in FIG. 6), for processing through the node-level condensation module 630 and return via the rack-level coolant return manifold 625 to the modular cooling unit. Within the modular cooling unit, the heated coolant is cooled by the heat exchanger, with heat being rejected to the facility coolant passing through the heat exchanger. The cooled liquid coolant is then pumped back to the nodes of the electronics rack, and in particular, to flow through the heat sinks and node-level condensation modules, in a manner such as described above.

At higher heat fluxes, a portion of the impinging coolant vaporizes within the coolant-carrying channels, with a liquid and vapor mixture flowing down the length of the channels. However, the vapor phase may also egress through the vapor-permeable region(s) of the membrane into the vapor transport channels of the heat sink cap, leaving a relatively liquid-rich coolant exhaust flowing in the coolant channels. This local removal of the vapor helps maintain a high heat transfer coefficient, reduces the pressure drop, and reduces dryout within the heat sink. The separated vapor can then be reintroduced into the coolant exhaust (e.g., a two-phase exhaust mixture) exiting from the heat sink structure. The two-phase coolant effluent flows to the node-level condensation module, where the vapor is condensed, for example, with the assistance of sub-cooled coolant provided to the condenser. In the node-level condensation module, the diverted, sub-cooled coolant is, for example, mixed or sprayed directly into the two-phase mixture from the heat sink structure(s), leading to direct-contact condensation of the vapor. Warm, single-phase fluid then leaves the condensation module for return to the modular cooling unit, to be chilled and pumped back to the nodes to repeat the process.

Advantageously, the node-level condensation module described herein: reduces pressure drop in channels, tubings and manifolds by providing a condensed, single-phase liquid flow from the node to the rack-level structures (instead of a two-phase mixture); eliminates the need for rack-level vapor separation and condensing; and in the case of a single-fluid, direct-contact condensing approach such as described above in connection with FIG. 8, there is the possibility of incorporating the cooling solution into existing single-phase platforms, since the rack-level architecture is similar; and in the case of single-fluid, direct-contact condensing, the potential exists for fine-tuning cooling performance through the use of electronic valving 640 (FIG. 6) such that the liquid flowrate to the heat sink channels and/or the condenser module is adjustable (for example, as described above in connection with the control process of FIG. 7).

Figure 9:
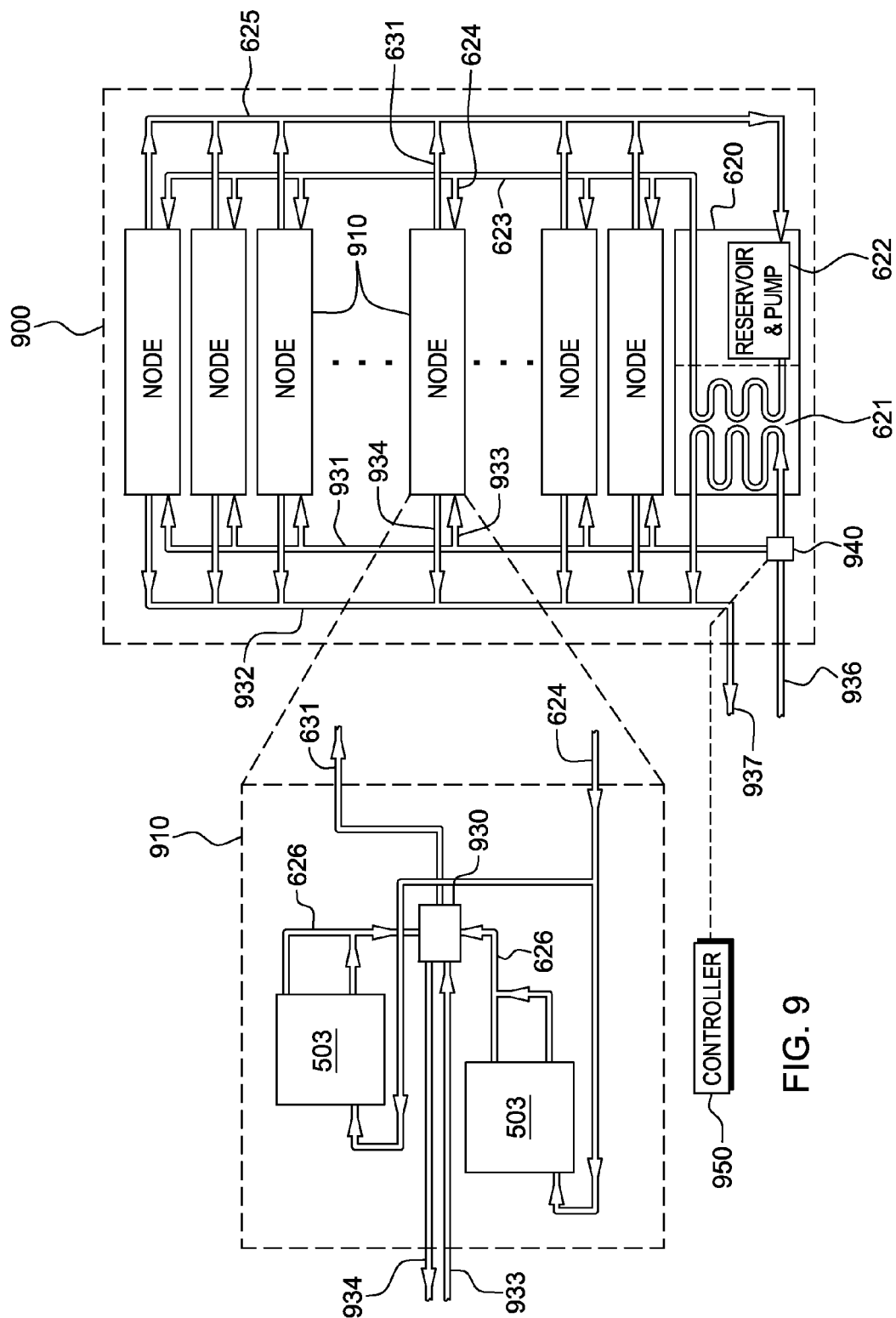
FIG. 9 is a schematic of an alternate embodiment of a cooled electronics apparatus comprising an electronic subsystem or node with multiple heat sinks, and illustrating an alternate embodiment of a node-level condensation module, in accordance with one or more aspects of the present invention.
Figure 10:
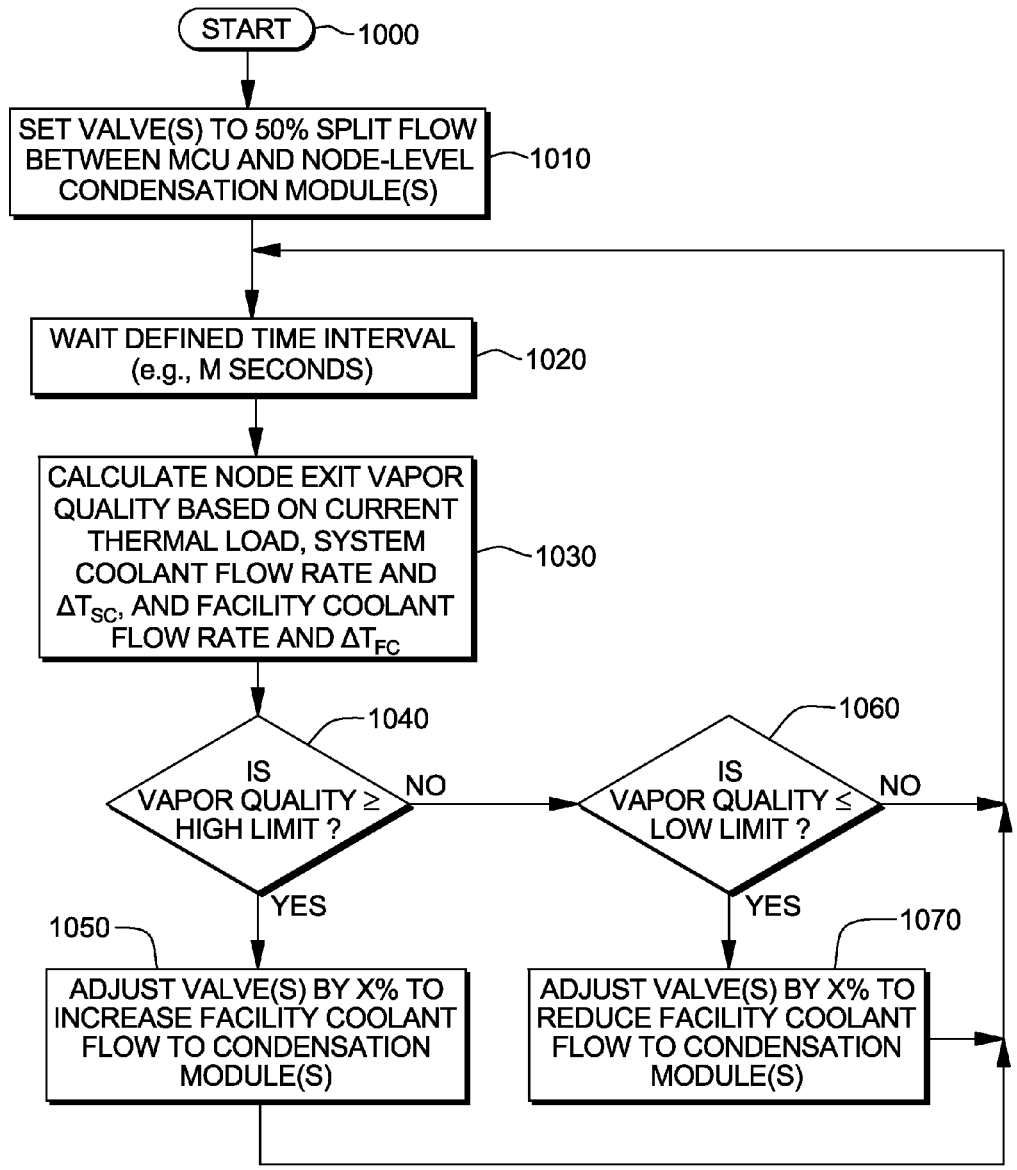
FIG. 10 depicts one embodiment of a control process for adjusting flow of facility coolant to the node-level condensation modules of a cooled electronics apparatus such as depicted in FIG. 9, in accordance with one or more aspects of the present invention.
Figure 11:
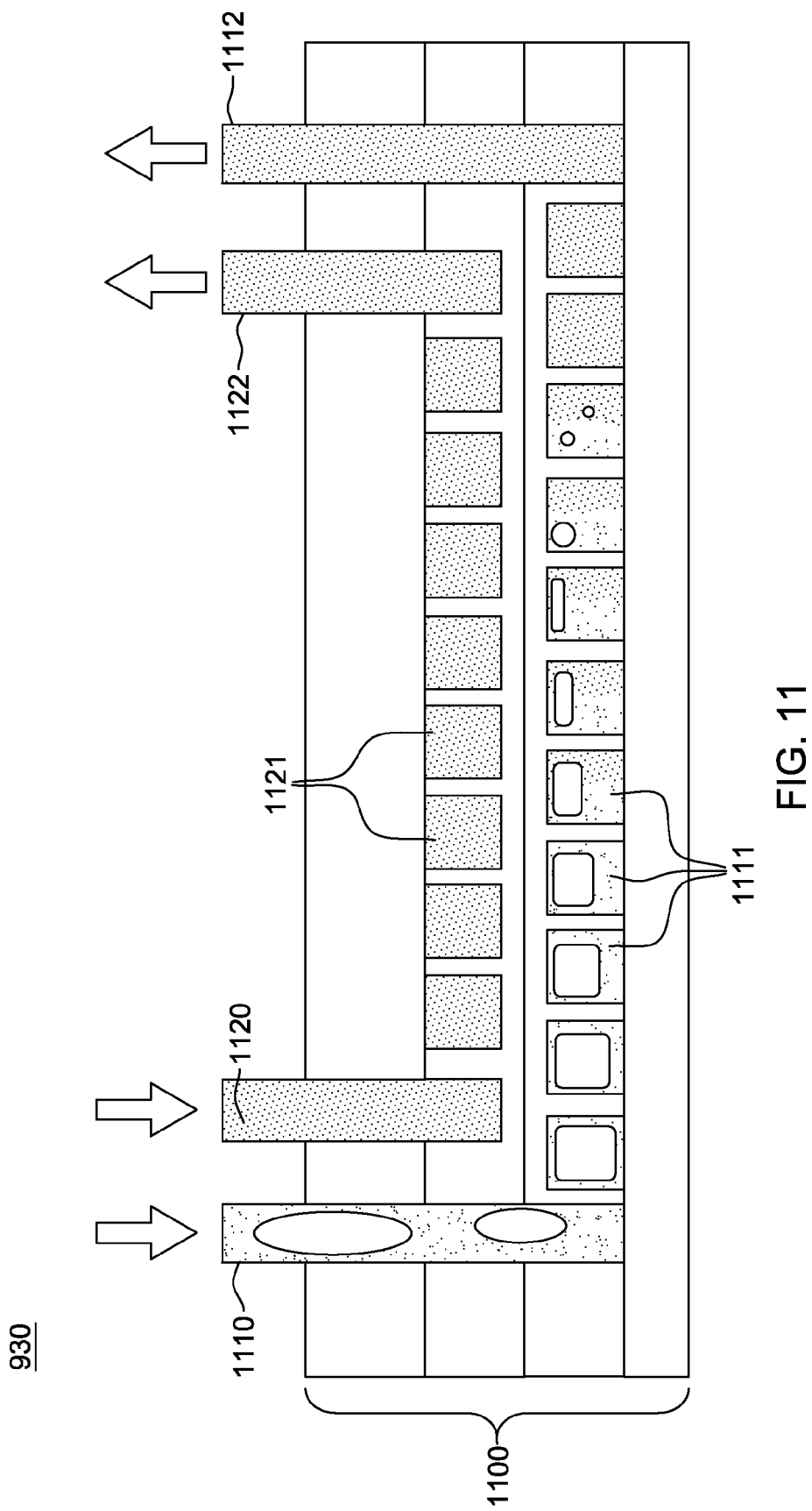
FIG. 11 is a schematic of one embodiment of an indirect-cooled, node-level condensation module for the cooled electronics apparatus of FIG. 9, in accordance with one or more aspects of the present invention.

By way of further example, FIGS. 9-11 depict an alternate cooled electronics apparatus comprising multiple heat sink structures, such as depicted in FIGS. 5A-5D. In this embodiment, two heat sink structures 503 are illustrated within an electronic subsystem or node 910 of an electronics rack 900. The cooling apparatus includes a modular cooling unit 620, such as described above. Modular cooling unit 620 includes a liquid-to-liquid heat exchanger 621 and a reservoir with an associated pump 622 for providing cooled liquid coolant via a coolant supply manifold 623 and node-level supply lines 624 to the coolant inlet ports of the respective heat sinks 503. The vented coolant vapor is output from the heat sink structures 503, in one embodiment, separate from the coolant exhaust, and is combined outside the heat sink structures within a single coolant exhaust line 626 as a two-phase mixture. Coolant exhaust line 626 is coupled to a node-level condensation module 930, which in this example, is an indirect-cooled, condensation module. For example, the condensation module embodiment of FIG. 9 employs a two-fluid condensation scheme, wherein (by way of example) a liquid-cooled structure within the condensation module may be employed to condense coolant vapor received into the module via coolant exhaust line 626.

In the two-fluid condensation approach of the cooled electronics apparatus of FIG. 9, a cold (or chilled) facility coolant is received via facility supply and return manifolds 931, 932 and node-level facility coolant supply and return lines 933, 934 to the individual node-level condensation modules 930 associated with the one or more electronic subsystems or nodes 910 of the electronics rack 900. The cooled electronics apparatus further includes a control valve 940 controlled by a controller 950. In this embodiment, control valve 940 divides the facility coolant flow received via a rack-level facility coolant loop, comprising a facility coolant supply line 936 and a facility coolant return line 937, between the liquid-to-liquid heat exchanger 621 and the facility coolant supply manifold 931. One control process implanted by controller 950 for controlling control valve 940 is depicted in FIG. 10.

FIG. 10 depicts one embodiment of a control process for controlling the control valve(s) in a dynamically adjustable control valve implementation such as depicted in FIG. 9. Processing starts 1000 by setting (in one embodiment) the valve(s) to a 50% split of the cooled facility coolant flow between the modular cooling unit and the node-level condensation modules 1010. Processing waits a predefined time, such as M seconds 1020, before determining the node-level exit vapor quality, based on the current thermal load of the node, system coolant flowrate and change in temperature ($\Delta T_{SC}$), and facility coolant flowrate and change in temperature ($\Delta T_{FC}$) 1030. Appropriately positioned flowrate and temperature sensors facilitate these determinations. Processing then determines whether the determined vapor quality is at or above a high-quality threshold 1040, and if "yes", then the valve is adjusted to increase (for example, by a set percentage (X %)) the facility coolant flow to the node-level condensation modules 1050 to provide greater cooling to the condenser, and thus, greater vapor-condensing. Processing then waits the predetermined time interval (e.g., M seconds) before again evaluating the system coolant flowrate and system coolant change in temperature ($\Delta T_{SC}$), as well as facility coolant flowrate and facility coolant change in temperature ($\Delta T_{FC}$) 1030. If the vapor quality is below the upper threshold, then processing determines whether the vapor quality is at or below a lower quality threshold 1060. If "yes", then the control valve is automatically adjusted (for example, by the predefined percentage (X %)) to reduce the flow of facility coolant to the node-level condensation modules 1070. Thereafter, processing waits the defined time interval 1020 before repeating the process. The vapor quality used in the rack level control implementation is, in one embodiment, the maximum determined vapor quality among the nodes.

FIG. 11 depicts one embodiment of a node-level condensation module 930 embodying an indirect-cooling approach to condensing coolant vapor within the module. In the illustrated embodiment, node-level condensation module 930 comprises multiple thermally conductive layers 1100, fabricated, for example, of copper or aluminum. A first coolant inlet 1110 is coupled to receive the two-phase coolant exhaust mixture from the one or more heat sink structures. This two-phase coolant exhaust mixture is passed through one or more condensing channels, which may comprise parallel or serpentine channels within the condensation module. Warm liquid coolant exhaust is output via coolant outlet 1112 for return via node-level return line 631 to rack-level coolant return manifold 625, to repeat the cooling process. The vapor-condensation is indirect, in that heat is removed to the facility coolant via conduction to a liquid-cooled structure comprising one or more cooling channels 1121 overlying the one or more condensing channels 1111. As illustrated, a second coolant inlet 1120 is coupled to receive cooled facility coolant, for example, via node-level facility coolant supply line 933 from facility coolant supply manifold 931. The facility coolant is exhausted from the condensation module via a second, facility coolant outlet 1122 and returned via node-level facility return line 934 to the rack-level facility coolant manifold 932.

Referring collectively to FIGS. 9-11, note that all sub-cooled system coolant in this implementation is pumped directly to the heat sink structures for use in cooling the associated electronics component(s) of the electronic subsystem. The vented vapor and two-phase coolant exhaust are merged within the electronic subsystem and plumbed to the node-level condensation module 930, where the two-phase mixture is condensed into a single-phase liquid through heat exchange with the facility coolant passing through the liquid-cooled structure of the condensation module. This facility coolant, for example, may be chilled house water obtained by splitting off a fraction of the chilled facility coolant pumped to the modular cooling unit for sub-cooling of the system or working coolant. This arrangement results in additional plumbing connections at each node, and the need for additional manifolding. However, the arrangement has the advantage of requiring the smallest coolant flow, and potentially pressure drop, since all of the coolant is used in direct cooling, instead of being split at the node to cool both the heat sink structures and the condensation module.

In operation, at low heat loads, the fluid exiting the heat sink structures may be warm, single-phase liquid, in which case condensation within the condensation module is unnecessary, and all of the facility coolant can be diverted to the modular cooling unit to maximize sub-cooling. However, as the heat load rises, vapor quality increases within the nodes, and it is desirable to condense the coolant vapor at the node-level to ensure that only warm liquid departs from the node back to the modular cooling unit. In this case, the electronic valve 940 diverts more facility coolant flow to the condensation modules within the nodes, and less to the modular cooling unit. In the implementation of FIG. 9, only a single, primary diverting control valve is depicted, with the fraction being set by the maximum thermal load experienced within the electronics rack.

Figure 12:
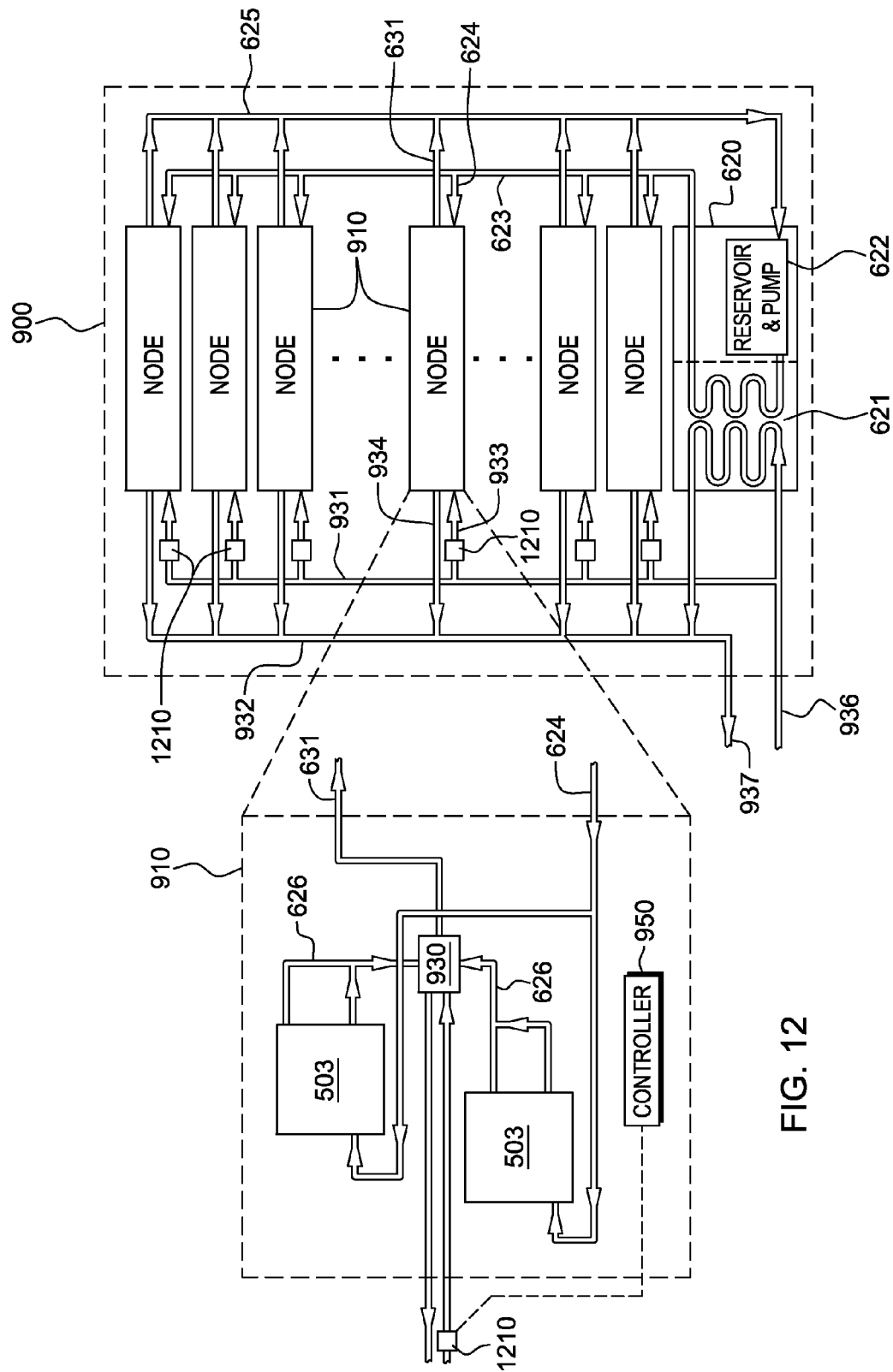
FIG. 12 is a schematic of another embodiment of a cooled electronics apparatus comprising an electronic subsystem or node with multiple heat sinks and indirect-cooled, node-level vapor-condensing, in accordance with one or more aspects of the present invention.

FIG. 12 depicts an alternate implementation of a cooled electronics apparatus comprising multiple heat sink structures, such as depicted in FIGS. 5A-5D, and a node-level condensation module such as depicted in FIGS. 9 & 11, and described above. In this implementation, the single control valve 940 of FIG. 9 is replaced by a plurality of node-level control valves 1210 coupled in fluid communication with the node-level facility coolant supply lines 933 coupling the respective node-level condensation module 930 and the facility coolant supply manifold 931. In one embodiment, the node-level control valves 1210 set the facility coolant flow-rate through the respective node-level condensation module. In this embodiment, a fixed percentage of the facility coolant is split between the liquid-to-liquid heat exchanger 621 of the modular cooling unit 620 and the facility coolant supply manifold 931 of the electronics rack 1200. A single controller or multiple controllers within the electronics rack could be coupled to automatically control the plurality of control valves 1210, for example, to independently adjust facility coolant flow through the respective node-level condensation modules 930, as required. In this implementation, only node-level condensation modules that require cooling to condense coolant vapor would receive the facility-chilled coolant. For example, the electronic valve(s) may be set based on measurements of the respective heat load (or power) within a given electronic subsystem, from which coolant vapor quality may be estimated for a given system coolant and facility coolant flowrate, and temperature changes ($\Delta T_{SC}$ & $\Delta T_{FC}$). The control process could be similar to that depicted by FIG. 10 and implemented at the node level by using vapor quality determined at each individual node.

Figure 13:
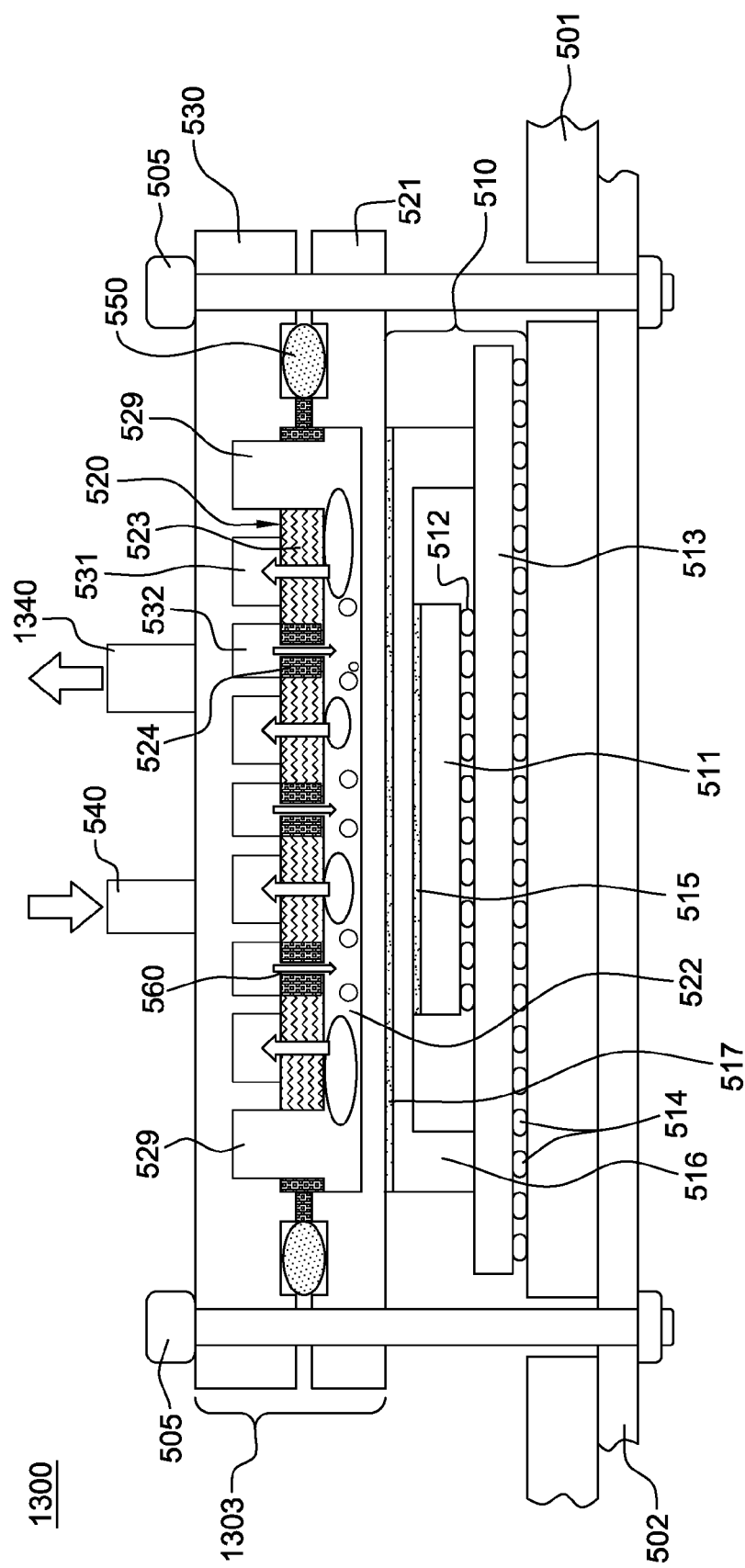
FIG. 13 is a cross-sectional elevational view of another embodiment of a cooled electronic structure which may be employed within a cooled electronics apparatus, in accordance with one or more aspects of the present invention.
Figure 14:
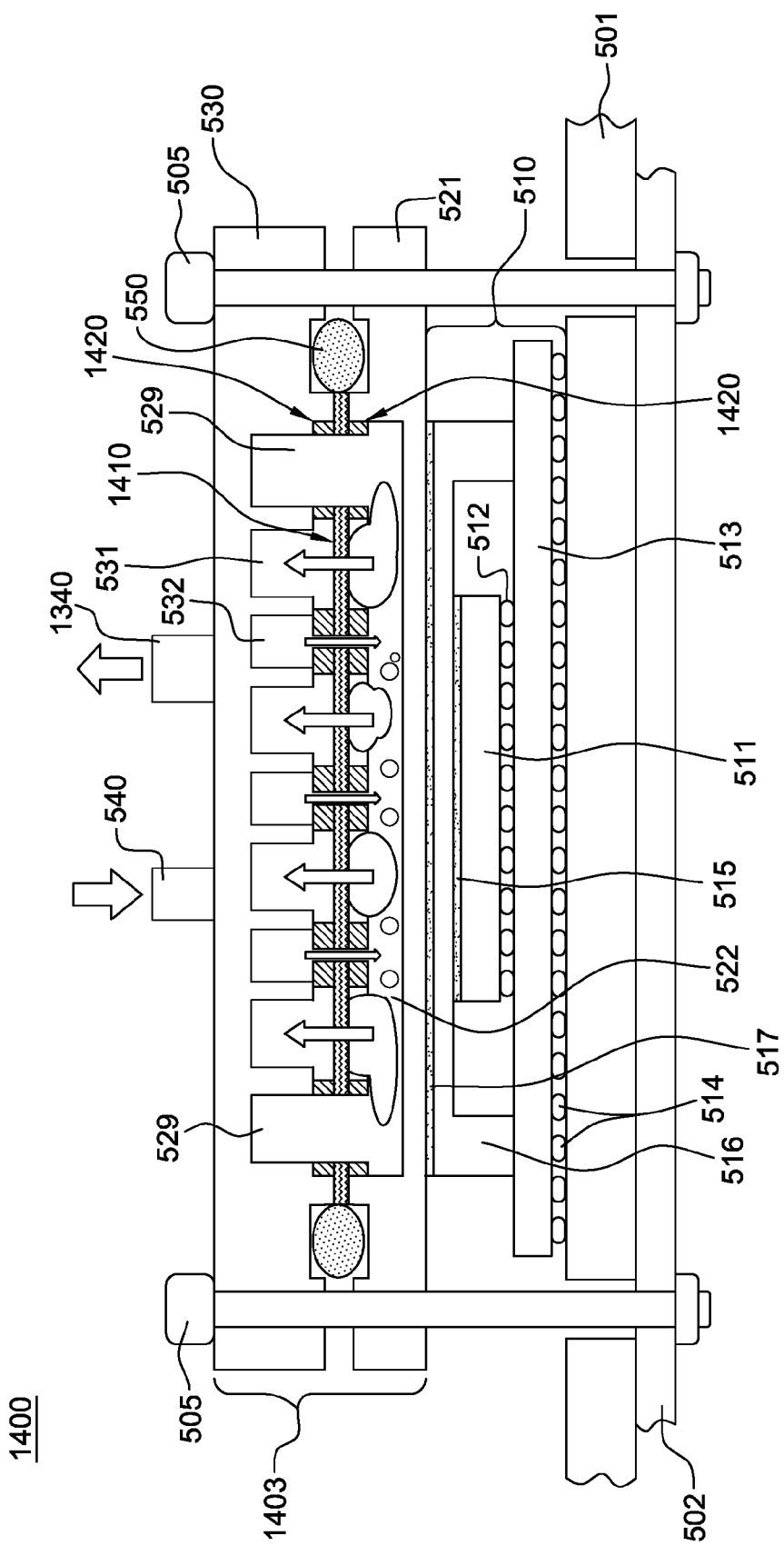
FIG. 14 is a cross-sectional elevational view of further embodiment of a cooled electronic structure which may be employed in a cooled electronics apparatus, in accordance with one or more aspects of the present invention.

The above-described, cooled electronics apparatuses may employ different heat sink structures than that depicted above in FIGS. 5A-5D By way of further example, FIGS. 13 & 14 depict two alternative cooled electronic structures which may be coupled at the node-level to a condensation module, such as described herein.

As noted, FIG. 13 depicts an alternate embodiment of a cooled electronics structure, generally denoted 1300, in accordance with one or more aspects of the present invention. Cooled electronic structure 1300 is similar to cooled electronic structure 500 of FIGS. 5A-5D, except the layers that make up heat sink 1303 of FIG. 13 are modified from the layers that make up heat sink 503 (see FIG. 5A).

Specifically, as shown in FIG. 13, cooled electronic structure 1300 includes, in this embodiment, electronic component 510, such as an electronic module, mounted to printed circuit board 501, with an associated back plate 502. Heat sink 1303 is mechanically coupled via securing mechanisms 505 to back plate 502 of printed circuit board 501, which provide compressive loading of heat sink 1303 to electronic component 510. Electronic component 510 includes, in this embodiment, integrated circuit chip 511 connected to chip carrier or substrate 513 via a first plurality of solder ball connections 512. Substrate 513 is electrically connected to printed circuit board 501 via a second plurality of solder ball connections 514. A thermally conductive cap 516 is interfaced to integrated circuit chip 511 via first thermal interface material 515, and to heat sink 1303 via second interface material 517, which may be the same or different interface materials.

Heat sink 1303 is again a multilayer heat sink with a heat sink base 521, a membrane structure 520, and a heat sink cap 530. Heat sink base 521 comprises one or more coolant-carrying channels 522, each of which may comprise a microchannel structure, such as described above. In operation, heat from the electronic component is rejected to coolant within the coolant-carrying channels in the heat sink base 521, causing boiling of the coolant.

As illustrated in FIG. 13, various regions of the coolant-carrying channels are capped by at least one vapor-permeable region 523 of membrane 520. Disposed over these regions are vapor transport channels 531 formed in heat sink cap 530. Thus, localized venting of vapor directly from the coolant-carrying channels, across the vapor-permeable membrane into the vapor transport channels is provided within the heat sink. In one embodiment, membrane 520 is modified to include, in addition to the at least one vapor-permeable region 523, at least one vapor-impermeable region 524. In one embodiment, the at least one vapor-impermeable region 524 comprises a plurality of parallel-extending digits that are interdigitated with a plurality of vapor-permeable areas of the at least one vapor-permeable region 523. The vapor-impermeable digits extend substantially transverse to the coolant-carrying channels 522.

In the embodiment depicted, at least one orifice 560 is provided in each of the vapor-impermeable digits where extending over a respective coolant-carrying channel. Coolant is introduced into the coolant-carrying channels through orifices 560 via liquid coolant delivery channels 532, which in one embodiment, are interdigitated with the vapor transport channels 531 within the heat sink cap 530. Liquid coolant delivery channels 532 are in fluid communication with a liquid coolant inlet port 540 of heat sink 1303. Coolant exhaust is discharged via coolant exhaust channel(s) 529 through a coolant exhaust outlet port 1340. In this embodiment, the vapor transport channels 532 couple to the coolant exhaust channel(s) 529 within the heat sink and a two-phase coolant exhaust is output via coolant exhaust outlet port 1340.

As with the cooled electronic structure embodiment of FIGS. 5A-5D, heat sink base 521 and heat sink cap 530 are configured to accommodate, in this embodiment, an O-ring 550 to seal coolant and vapor within the heat sink. Coolant and vapor are additionally sealed within the heat sink by the vapor-impermeable region 524 defined around the perimeter of the membrane 520, that is, where held by the heat sink base and heat sink cap, as illustrated in FIG. 13.

In one embodiment, the heat sink base and heat sink cap are fabricated of a metal material, such as copper, the coolant comprises water, and the membrane is a vapor-permeable, liquid-impermeable membrane (except for the jet orifices), such as a vapor-permeable PTFE or polypropylene material.

FIG. 14 depicts another embodiment of a cooled electronic structure 1400, in accordance with one or more aspects of the present invention. The cooled electronic structure of FIG. 14 is similar to cooled electronic structure 500 of FIGS. 5A-5D, except that the single-layer membrane 523 of FIGS. 5A-5D is replaced by a multilayer structure comprising (in one embodiment) a vapor-permeable membrane 1410 positioned between two masking plates 1420, as illustrated in FIG. 14.

Specifically, as shown in FIG. 14, the cooled electronic structure includes, in this embodiment, electronic component 510, such as an electronic module, mounted to a printed circuit board 501, with an associated back plate 502. Heat sink 1403 is mechanically coupled via securing mechanisms 505 to back plate 502 of printed circuit board 501, which provide compressive loading of heat sink 1403 to electronic component 510. Electronic component 510 includes, in this embodiment, integrated circuit chip 511 connected to chip carrier or substrate 513 via a first plurality of solder ball connections 512. Substrate 513 is electrically connected to printed circuit board 501 via a second plurality of solder ball connections 514. A thermally conductive cap 516 is interfaced to integrated circuit chip 511 via first thermal interface material 515, and to the heat sink 1403 via second thermal interface material 517, which may be the same or different interface materials.

Heat sink 1403 is again a multilayer heat sink, with a heat sink base 521, a multilayer membrane structure comprising masking plates 1420, and vapor-permeable membrane 1410, and a heat sink cap 530. Heat sink base 521 comprises one or more coolant-carrying channels 522, each of which may comprise a microchannel structure, as described above. In operation, heat from the electronic component is rejected to coolant within the coolant-carrying channels in the heat sink base 521, causing (in one mode) boiling of the coolant.

As illustrated in FIG. 14, various regions of the coolant-carrying channels 522 are capped by vapor-permeable membrane 1410, which is positioned in between masking plates 1420 and exposed to the coolant-carrying channels via open regions in masking plates 1420. These exposed regions of vapor-permeable membrane 1410 align to vapor transfer channels 531, which vent vapor egressing from the coolant-carrying channels, as explained above.

Jet orifices or nozzles are defined in the multi-layer membrane structure via aligned through-holes in masking plates 1420, and vapor-permeable membrane 1410. As explained above, these jet orifices inject coolant from liquid coolant delivery channels 532 into the coolant-carrying channels 522 in heat sink base 521.

In one embodiment, masking plates 1420 comprise metal masking plates, which may be epoxied, soldered or press-fitted to heat sink base 521 and heat sink cap 530. Additionally, masking plates 1420 may be epoxied to the vapor-permeable membrane 1410 for better sealing. Note also that the open regions in the masking plate 1420 exposed to the coolant-carrying channels 522 operate as vapor traps, where vapor collects between the channels and the membrane. This further facilitates egress of the vapor across the membrane into the vapor transport channels 532. Note further, that in the depicted multilayer membrane structure embodiment, the vapor-permeable membrane of FIG. 14 need not have a vapor-impermeable region, such as in the embodiments described above. Note also that other multilayer membrane structure embodiments may alternatively be employed with a heat sink structure as described herein. For example, a single masking plate could be employed with the vapor-permeable membrane, if desired.

Those skilled in the art will note from the above discussion that the heat sink structures described herein include a heat sink base which comprises one or more coolant-carrying channels. In one embodiment, these coolant-carrying channels have sub-millimeter hydraulic diameters, and also are referred to herein as "microchannels". Such small channels help increase the surface area, as well as the single-phase heat transfer coefficient of the coolant within the channels. The channels can be made via chemical etching or mechanical methods, such as skiving or end-milling. In one embodiment, the heat sink is fabricated of copper, due to its high heat transfer coefficient and relatively simple machineability. However, other materials, such as aluminum and silicon are also suitable, though may have disadvantages in terms of thermal conductivity, fragility and machineability.

The second layer of the heat sink comprises a vapor-permeable membrane, such as a porous, hydrophobic membrane, in the case where the coolant comprises water. Examples of micro/nano-porous, natively hydrophobic membranes include polypropylene, PTFE, and nylon. Natively hydrophilic materials, such as porous glass, porous silicon, porous aluminum and porous organic materials could also be used, but require a liquid-phobic coating to prevent liquid from leaking into the vapor channels. The porous membrane is prepared such that the regions with the nozzles or orifices, as well as the edges of the membrane, are hardened and non-porous to provide better nozzle definition as well as edge sealing. The membrane can be patterned using a variety of techniques, such as hot press (wherein a heated master is pressed onto the porous membrane to plastically deform it and close the pores in the desired regions), laminating with a non-porous material (one example of which is laminated porous PTFE, where the laminate is made of non-porous polypropylene), or epoxy/photoresist infiltration (where epoxy could be used to selectively close the pores and provide additional mechanical stiffness in desired regions).

In an alternate embodiment, the second layer of the heat sink might comprise a multilayer membrane structure, for example, such as depicted in FIG. 14, and described above. In such a multilayer structure, the membrane may be a vapor-permeable membrane, for instance, a porous, hydrophobic membrane, in the case where the coolant comprises water. Additionally, the masking plate may be fabricated of various vapor-impermeable materials, with metal being one example.

The third layer of the heat sink, that is, the heat sink cap, comprises relatively larger liquid and vapor channels which help distribute the fluid from and to the inlet and outlet ports of the heat sink. In order to minimize the pressure drop in these channels, the hydraulic diameter is maintained relatively large. A large hydraulic diameter also reduces the pressure drop when the vented vapor is reintroduced to the coolant effluent (which may be a two-phase effluent) at the heat sink level. The heat sink cap can be made of copper or aluminum or any other material with a similar coefficient of thermal expansion (CTE) as that of the heat sink base to avoid excessive thermal stresses developing.

The coolant (or working fluid) should be compatible with the selected membrane, thus requiring specific fluid/membrane combinations. Examples, of coolants (or working fluids) include: water at sub-ambient pressures, dielectric fluids at atmospheric pressure, and refrigerants at higher pressures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A cooling apparatus comprising:
at least one heat sink to cool at least one electronic component of an electronic subsystem of multiple electronic subsystems of an electronics rack, the at least one heat sink comprising at least one coolant-carrying channel for a first coolant to flow therethrough, the first coolant providing two-phase cooling to the at least one electronic component, and being discharged from the at least one heat sink as coolant exhaust with coolant vapor;

a node-level condensation module disposed within the electronic subsystem comprising the at least one electronic component, the node-level condensation module being coupled in fluid communication with the at least one heat sink and receiving the coolant exhaust therefrom, the node-level condensation module being liquid-cooled via a second coolant to facilitate condensing the coolant vapor in the received coolant exhaust within the electronic subsystem before return to a rack-level coolant return manifold of the electronics rack, the node-level condensation module comprising a liquid-to-liquid heat exchanger providing conductive heat transfer from the first coolant to the second coolant to facilitate condensing of the first coolant vapor in the node-level condensation module;

a controller automatically controlling at least one of the liquid-cooling of the at least one heat sink or the liquid-cooling of the node-level condensation module; and a control valve for adjusting a flow rate of the second coolant to the node-level condensation module, the control valve being automatically controlled by the controller based on a characterization of the coolant vapor in the coolant exhaust.

2. The cooling apparatus of claim 1, wherein the control valve comprises a node-level control valve controlling a flow rate of the second coolant to the node-level condensation module, the node-level control valve being automatically controlled by the controller based on the characterization of the coolant vapor in the coolant exhaust.

3. The cooling apparatus of claim 1, wherein the node-level condensation module provides warm, single-phase liquid coolant to the rack-level coolant return manifold, and wherein the node-level condensation module is spaced from the at least one heat sink within the electronic subsystem.

4. The cooling apparatus of claim 1, wherein one heat sink of the at least one heat sink comprises:
a thermally conductive structure comprising at least one coolant-carrying channel; and
a membrane structure associated with the at least one coolant-carrying channel, the membrane structure comprising at least one vapor-permeable region, at least a portion of the at least one vapor-permeable region overlying a portion of the at least one coolant-carrying channel and facilitating removal of vapor from the at least one coolant-carrying channel, and the membrane structure further comprising at least one orifice coupled to inject coolant onto at least one surface of the at least one coolant-carrying channel intermediate ends of the at least one coolant-carrying channel.

5. The cooling apparatus of claim 1, wherein the control valve comprises a rack-level control valve for directing fractions of the second coolant to the node-level condensation module, and to a rack-level coolant conditioning unit receiving the first liquid coolant from the rack-level coolant return manifold.

6. A cooled electronics apparatus comprising:
an electronics rack comprising multiple electronic subsystems, one electronic subsystem of the multiple electronic subsystems comprising at least one heat-generating electronic component to be cooled; and
a cooling apparatus for cooling the at least one heat-generating electronic component, the cooling apparatus comprising:

at least one heat sink coupled to at least one heat-generating electronic component, the at least one heat sink comprising at least one coolant-carrying channel for a first coolant to flow therethrough, the first coolant providing two-phase cooling to the at least one electronic component and being discharged from the at least one heat sink as coolant exhaust with coolant vapor;

a node-level condensation module disposed within the electronic subsystem comprising the at least one heat-generating electronic component, the node-level condensation module being coupled in fluid communication with the at least one heat sink and receiving the coolant exhaust therefrom, the node-level condensation module being liquid-cooled via a second coolant to facilitate condensing the coolant vapor in the received coolant exhaust within the electronic subsystem before return to a rack-level coolant return manifold of the electronics rack, the node-level condensation module comprising a liquid-to-liquid heat exchanger providing conductive heat transfer from the first coolant to the second coolant to facilitate condensing of the first coolant vapor in the node-level condensation module;

a controller automatically controlling at least one of the liquid-cooling of the at least one heat sink or the liquid-cooling of the node-level condensation module; and a rack-level control valve for directing fractions of the second coolant to the node-level condensation module and to a rack-level coolant conditioning unit coupled to receive the coolant exhaust from the rack-level coolant return manifold, the rack-level control valve being automatically controlled by the controller to adjust the fraction of the second coolant flowing to the node-level condensation module based on a characterization of the coolant vapor in the coolant exhaust.

7. The cooled electronics apparatus of claim 6, wherein each electronic subsystem comprises at least one electronic component to be cooled, and wherein the cooling apparatus comprises multiple heat sinks, each heat sink being associated with at least one electronic component of a respective electronic subsystem of the electronics rack, and wherein the cooling apparatus further comprises multiple node-level condensation modules, each node-level condensation module being disposed within a respective electronic subsystem of the multiple electronic subsystems, and being coupled to the rack-level coolant return manifold, the multiple node-level condensation modules providing the coolant exhaust as single-phase coolant to the rack-level coolant return manifold.

* * * * *